US010455734B2

(12) United States Patent
Tochiyama et al.

(10) Patent No.: US 10,455,734 B2
(45) Date of Patent: Oct. 22, 2019

(54) COOLING APPARATUS HAVING VERTICAL FLOW CHANNELS

(71) Applicant: Mitsubishi Electric Corporation, Chiyoda-ku, Tokyo (JP)

(72) Inventors: Shigenobu Tochiyama, Tokyo (JP); Seiji Haga, Tokyo (JP); Masayoshi Tamura, Tokyo (JP); Satoshi Ishibashi, Tokyo (JP); Shinsuke Idenoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 8 days.

(21) Appl. No.: 15/622,187

(22) Filed: Jun. 14, 2017

(65) Prior Publication Data

US 2017/0280589 A1  Sep. 28, 2017

Related U.S. Application Data

(62) Division of application No. 14/086,120, filed on Nov. 21, 2013.

(30) Foreign Application Priority Data

Dec. 7, 2012 (JP) .................................. 2012-268346

(51) Int. Cl.
H05K 7/20 (2006.01)
H01L 23/473 (2006.01)
H01L 23/367 (2006.01)

(52) U.S. Cl.
CPC ....... *H05K 7/20281* (2013.01); *H01L 23/473* (2013.01); *H01L 23/3677* (2013.01); *H01L 2924/0002* (2013.01); *H05K 7/20927* (2013.01)

(58) Field of Classification Search
CPC .............. H01L 23/473; H05K 7/20281; H05K 7/20927

(Continued)

(56) References Cited

U.S. PATENT DOCUMENTS 5,203,401 A * 4/1993 Hamburgen ......... G01R 1/0458
                                                        165/104.32
5,801,442 A * 9/1998 Hamilton .............. H01L 23/473
                                                        257/712

(Continued)

FOREIGN PATENT DOCUMENTS

DE  102010007086 A1  8/2011
DE  102013222496 A1  5/2014

(Continued)

OTHER PUBLICATIONS

Communication dated Sep. 3, 2015 from the German Patent and Trademark Office in counterpart application No. 102013224970.5.

(Continued)

*Primary Examiner* — Paul Alvare
(74) *Attorney, Agent, or Firm* — Sughrue Mion, PLLC; Richard C. Turner

(57) ABSTRACT

A liquid coolant supplying header is configured on a central portion in the width direction between an upper portion heatsink and a partitioning plate, a liquid coolant discharging header is configured on a central portion in the width direction between a lower portion heatsink and the partitioning plate so as to be parallel to the liquid coolant supplying header, vertical flow channels are formed so as to pass through the partitioning plate vertically on two sides in the width direction so as to be parallel to the liquid coolant supplying header, a liquid coolant distributing structural body is disposed inside the liquid coolant supplying header, and an external shape of the liquid coolant distributing structural body is formed such that flow channel cross- (Continued)

sectional area of the liquid coolant supplying header becomes gradually smaller from an upstream end toward a downstream end.

16 Claims, 11 Drawing Sheets

(58) Field of Classification Search
USPC ......................................................... 165/80.4
See application file for complete search history.

(56) References Cited

U.S. PATENT DOCUMENTS

| | | | | |
|---|---|---|---|---|
| 6,052,284 | A * | 4/2000 | Suga | H01L 23/473 361/699 |
| 6,386,278 | B1 * | 5/2002 | Schulz-Harder | F28F 3/083 165/146 |
| 7,187,548 | B2 * | 3/2007 | Meyer | H02M 1/44 165/80.4 |
| 8,120,914 | B2 * | 2/2012 | Kajiura | F28F 3/025 165/104.33 |
| 8,387,685 | B2 * | 3/2013 | Kimbara | H01L 23/473 165/169 |
| 2005/0128702 | A1 * | 6/2005 | Mongia | H01L 23/473 361/688 |
| 2006/0225867 | A1 * | 10/2006 | Park | H05K 7/20254 165/80.4 |
| 2006/0262502 | A1 * | 11/2006 | Chang | H01L 23/473 361/699 |
| 2007/0062674 | A1 * | 3/2007 | Ippoushi | H01L 23/473 165/80.4 |
| 2007/0068652 | A1 * | 3/2007 | Park | H01L 23/473 165/80.4 |
| 2008/0026284 | A1 * | 1/2008 | Fujii | H01M 2/105 429/120 |
| 2012/0103569 | A1 * | 5/2012 | Kim | H01S 3/0407 165/104.11 |
| 2014/0140117 | A1 * | 5/2014 | Ishibashi | H05K 7/20927 363/141 |

FOREIGN PATENT DOCUMENTS

| | | |
|---|---|---|
| JP | 2009-296708 A | 12/2009 |
| JP | 4699820 B2 | 6/2011 |
| JP | 2012-222333 A | 11/2012 |

OTHER PUBLICATIONS

Translation of German Patent Document DE 10 2010 007 086 A1 entitled Translation—DE 10 2010 007 086 A1.
Translation of Japanese Patent Document JP 2012-222333 A entitled Translation—JP 2012-222333 A.

* cited by examiner

COOLING APPARATUS HAVING VERTICAL FLOW CHANNELS

CROSS-REFERENCE APPLICATIONS

This is a Divisional application of U.S. application Ser. No. 14/086,120 filed Nov. 21, 2013, which claims priority from Japanese Patent Application No. 2012-268346 filed Dec. 7, 2012, the disclosures of which are incorporated herein by reference in their entirety.

BACKGROUND OF THE INVENTION

1. Field of the Invention

The present invention relates to a cooling apparatus that cools a heat-generating element such as a central processing unit (CPU), a large-scale integrated circuit (LSI), a power semiconductor, etc.

2. Description of the Related Art

In recent years, the density of generated heat in heat-generating elements such as CPUs, LSIs, power semiconductors, etc., has increased, and increases in cooling performance of the cooling apparatus are being sought.

In consideration of such conditions, conventional cooling apparatuses have been proposed in which a liquid coolant supplying flow channel and a liquid coolant discharging flow channel are formed inside a cooling substrate such that flow channel directions are parallel and so as to be separated by a predetermined distance in a direction that is perpendicular to the flow channel directions, and cooling flow channels are formed inside the cooling substrate so as to communicate with the liquid coolant supplying flow channel and the liquid coolant discharging flow channel so as to have respective flow channel directions perpendicular to the flow channel directions of the liquid coolant supplying flow channel and the liquid coolant discharging flow channel, the cooling flow channels forming two layers vertically and being arranged at a predetermined pitch in the flow channel directions of the liquid coolant supplying flow channel and the liquid coolant discharging flow channel (see Patent Literature 1, for example).

In this conventional cooling apparatus, one switching semiconductor element and one diode are disposed in series along the direction of circulation of the liquid coolant in the cooling flow channels on a front surface and a rear surface of the cooling substrate. Thus, it is claimed that the switching semiconductor elements or the diodes can be cooled efficiently, and cooling capacity can be increased, because the switching semiconductor elements or the diodes, which generate heat, are constantly cooled by liquid coolant from near the liquid coolant supplying flow channel that is in a sufficiently cooled state that has not risen in temperature.

CITATION LIST

Patent Literature

[Patent Literature 1] Japanese Patent No. 4699820 (Gazette)

In conventional cooling apparatuses, because flow channel cross-sectional area of the liquid coolant supplying flow channel is configured so as to be constant in the flow channel direction, flow velocity in the cooling flow channels that are connected upstream in the liquid coolant supplying flow channel is slower than flow velocity in the cooling flow channels that are connected downstream in the liquid coolant supplying flow channel due to inertial force of the liquid coolant inside the liquid coolant supplying flow channel. Thus, cooling performance of the cooling flow channels that are connected upstream in the liquid coolant supplying flow channel is poor compared to the cooling performance of the cooling flow channels that are connected downstream in the liquid coolant supplying flow channel, and one problem has been that irregularities in cooling performance arise between each of the power semiconductor elements that are disposed in parallel on the front surface and the rear surface of the cooling substrate. This problem becomes more pronounced as the number of power semiconductor elements that are disposed in parallel on the front surface and the rear surface of the cooling substrate is increased.

The present invention is aimed at solving such problems and an object of the present invention is to provide a cooling apparatus in which irregularities in cooling performance among respective heat-generating elements can be suppressed even if the number of heat-generating elements that are mounted is increased.

SUMMARY OF THE INVENTION

In order to achieve the above object, according to one aspect of the present invention, there is provided a cooling apparatus characterized in including; a frame-shaped main body portion that has upper and lower openings; an upper portion heatsink and a lower portion heatsink that are mounted above and below the main body portion so as to cover the upper and lower openings of the main body portion; a partitioning plate that is disposed so as to divide an internal portion of the main body portion into upper and lower sections, so as to form an upper portion space with the upper portion heatsink, and so as to form a lower portion space with the lower portion heatsink; a liquid coolant supplying header that is formed between the upper portion heatsink and the partitioning plate; a liquid coolant discharging header that is formed between the lower portion heatsink and the partitioning plate so as to have a flow channel direction that is parallel to a flow channel direction of the liquid coolant supplying header; a vertical flow channel that is separated from the liquid coolant supplying header by a predetermined distance in a width direction that is perpendicular to the flow channel directions, that passes through the partitioning plate vertically, that extends parallel to the flow channel direction of the liquid coolant supplying header, and that communicates between the upper portion space and the lower portion space; and a liquid coolant distributing structural body that is disposed inside the liquid coolant supplying header, that is configured into an external shape such that a flow channel cross-sectional area of the liquid coolant supplying header becomes gradually smaller from an upstream end toward a downstream end, and that distributes a liquid coolant that flows through the liquid coolant supplying header toward the vertical flow channel.

According to the present invention, because the liquid coolant distributing structural body that is configured into an external shape such that the flow channel cross-sectional area of the liquid coolant supplying header becomes gradually smaller from an upstream end toward a downstream end is disposed inside the liquid coolant supplying header, the quantity of flow of liquid coolant that is distributed toward the vertical flow channel from the upstream end of the liquid coolant supplying header is greater than the quantity of flow of liquid coolant that is distributed toward the vertical flow channel from the downstream end of the liquid coolant supplying header. Thus, irregularities in the distributed quantities of liquid coolant in the direction of circulation that result from inertial force of the liquid coolant that flows through the liquid coolant supplying header are alleviated, suppressing the occurrence of irregularities in cooling capacity in the direction of circulation. The direction of flow of the liquid coolant that flows through the liquid coolant supplying header is changed toward the vertical flow channel on the side surfaces of the liquid coolant distributing structural body, performing distribution of the liquid coolant smoothly. Thus, even if the number of heat-generating elements that are mounted is increased, the occurrence of irregularities in cooling performance among the respective heat-generating elements is suppressed.

DETAILED DESCRIPTION OF THE PREFERRED EMBODIMENTS

Preferred embodiments of a cooling apparatus according to the present invention will now be explained with reference to the drawings.

Embodiment 1

Figure 1:
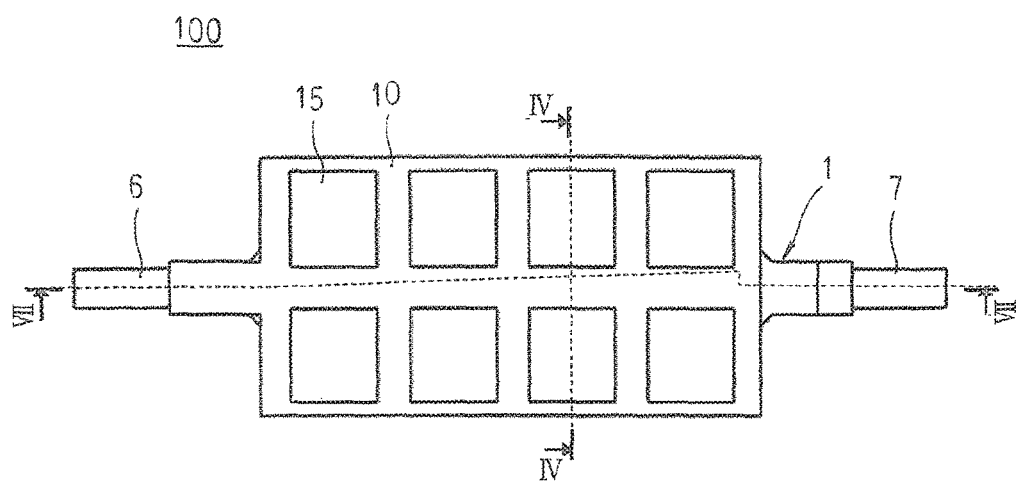
FIG. 1 is a plan that shows a cooling apparatus according to Embodiment 1 of the present invention.
Figure 2:
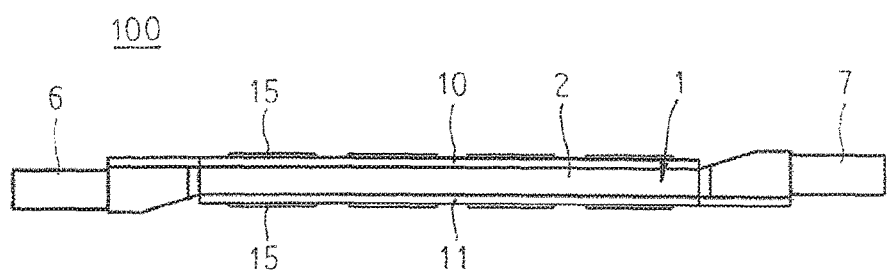
FIG. 2 is a side elevation that shows the cooling apparatus according to Embodiment 1 of the present invention.
Figure 3:
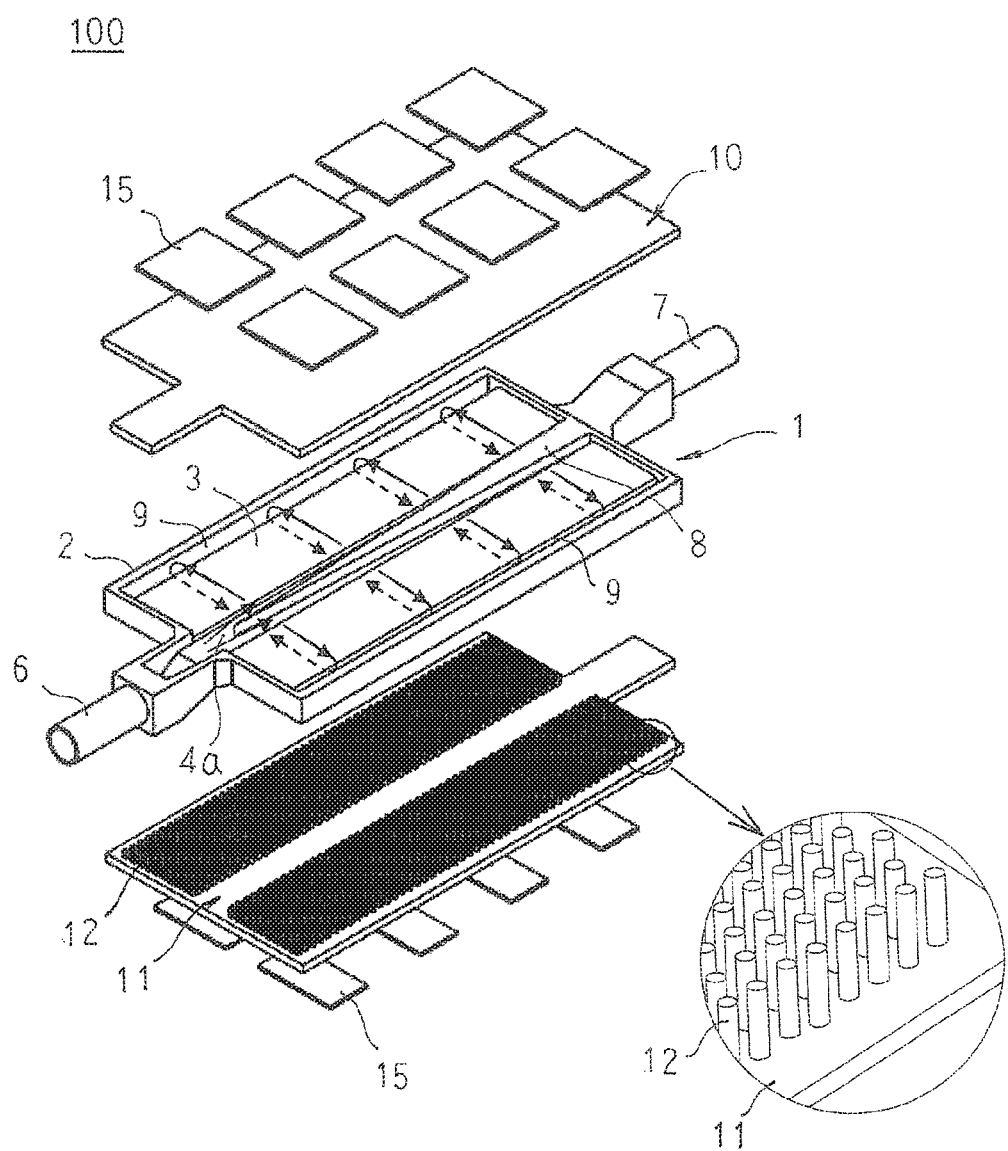
FIG. 3 is an exploded perspective that explains a configuration of the cooling apparatus according to Embodiment 1 of the present invention.
Figure 4:
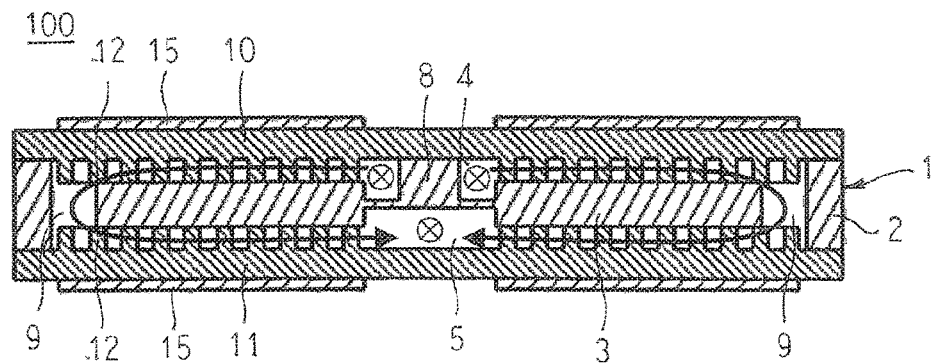
FIG. 4 is a cross section that is taken along Line IV-IV in FIG. 1 so as to be viewed in the direction of the arrows.
Figure 5:
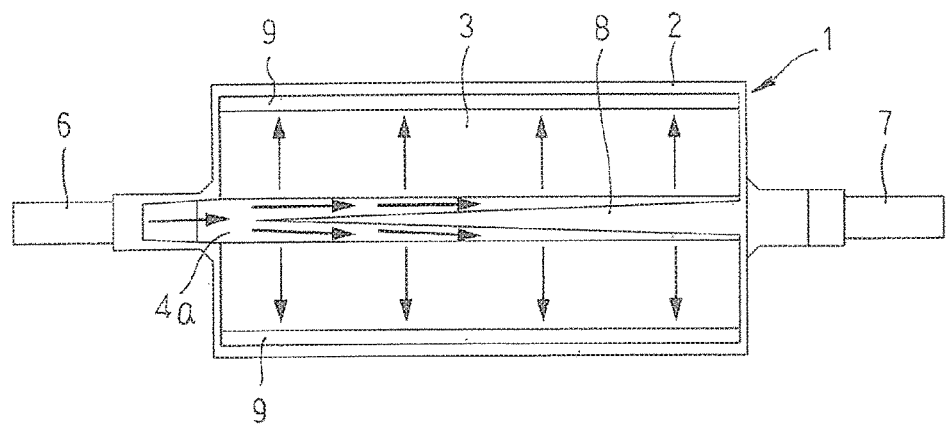
FIG. 5 is a plan that is viewed from an upper portion side that shows a state of the cooling apparatus according to Embodiment 1 of the present invention in which an upper portion heatsink is removed.
Figure 6:
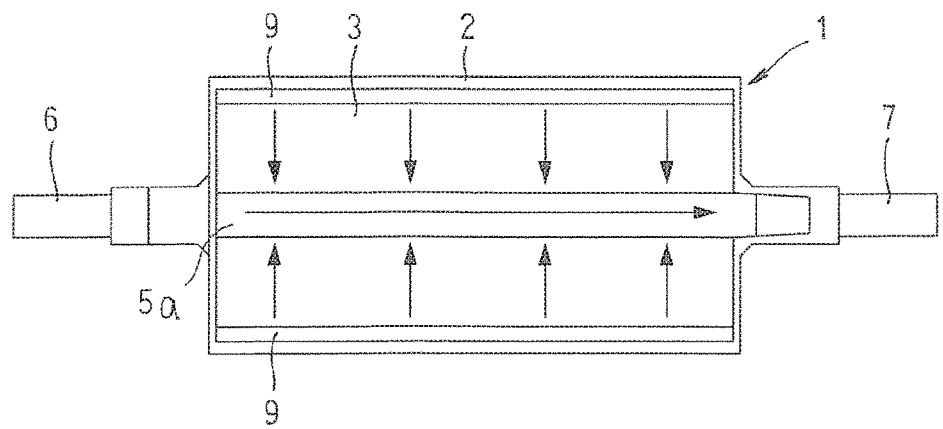
FIG. 6 is a plan that is viewed from a lower portion side that shows a state of the cooling apparatus according to Embodiment 1 of the present invention in which a lower portion heatsink is removed.
Figure 7:
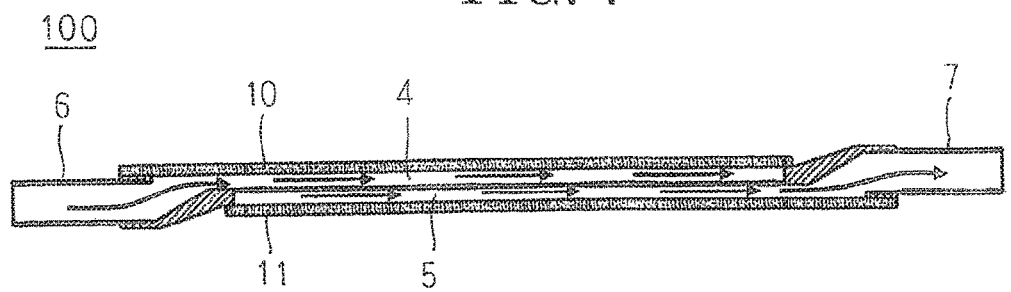
FIG. 7 is a cross section that is taken along Line VII-VII in FIG. 1 so as to be viewed in the direction of the arrows.

FIG. 1 is a plan that shows a cooling apparatus according to Embodiment 1 of the present invention, FIG. 2 is a side elevation that shows the cooling apparatus according to Embodiment 1 of the present invention, FIG. 3 is an exploded perspective that explains a configuration of the cooling apparatus according to Embodiment 1 of the present invention, FIG. 4 is a cross section that is taken along Line IV-IV in FIG. 1 so as to be viewed in the direction of the arrows, FIG. 5 is a plan that is viewed from an upper portion side that shows a state of the cooling apparatus according to Embodiment 1 of the present invention in which an upper portion heatsink is removed, FIG. 6 is a plan that is viewed from a lower portion side that shows a state of the cooling apparatus according to Embodiment 1 of the present invention in which a lower portion heatsink is removed, and FIG. 7 is a cross section that is taken along Line VII-VII in FIG. 1 so as to be viewed in the direction of the arrows. Moreover, in FIGS. 3 through 7, arrows represent liquid coolant flow.

In FIGS. 1 through 3, a cooling apparatus 100 includes: a water jacket 1; an upper portion heatsink 10 that is mounted onto an upper portion of the water jacket 1; and a lower portion heatsink 11 that is mounted onto a lower portion of the water jacket 1, and can contribute to cooling of heat-generating elements 15 such as CPUs, LSIs, power semiconductors, etc.

The water jacket 1 is a resin-molded body that is formed using a polyphenylene sulfide (PPS) resin, for example, and includes: a rectangular frame-shaped main body portion 2 that has a predetermined thickness; a partitioning plate 3 that is formed so as to have a flat, rectangular shape that has a thickness that is thinner than that of the main body portion 2, that is linked to a central portion of an inner peripheral surface of the main body portion 2 in a thickness direction, and that is disposed so as to divide an internal portion of the main body portion 2 into two sections in the thickness direction; a liquid coolant supplying groove 4a that is formed so as to extend longitudinally on the partitioning plate 3 over an entire longitudinal region of a central portion in a width direction of an upper surface of the partitioning plate 3; a liquid coolant discharging groove 5a that is formed so as to extend longitudinally on the partitioning plate 3 over an entire longitudinal region of a central portion in a width direction of a lower surface of the partitioning plate 3; a liquid coolant supplying port 6 that is linked to a first longitudinal end of the main body portion 2 so as to be connected to a first end of the liquid coolant supplying groove 4a; and a liquid coolant discharging port 7 that is linked to a second longitudinal end of the main body portion 2 so as to be connected to a second end of the liquid coolant discharging groove 5a.

In addition, a liquid coolant distributing structural body 8 is disposed so as to project from a bottom surface of the liquid coolant supplying groove 4a so as to extend from near a first end of the liquid coolant supplying groove 4a to a second end so as to have a predetermined height and such that a width widens gradually from near the first end of the liquid coolant supplying groove 4a toward the second end. In this case, as shown in FIG. 5, a bottom surface of the liquid coolant distributing structural body 8 is configured into a triangular prism that is an isosceles triangle, and has plane symmetry relative to a plane that passes through center in a width direction of the liquid coolant supplying groove 4a. The liquid coolant supplying groove 4a is thereby configured such that a groove cross-sectional area thereof becomes gradually smaller from near the first end of the liquid coolant supplying groove 4a toward the second end. A groove cross-sectional area of the liquid coolant discharging groove 5a, on the other hand, is constant from near the first end of the liquid coolant supplying groove 4a toward the second end.

Vertical flow channels 9 are formed over entire longitudinal regions of first and second end portions in the width direction of the partitioning plate 3 so as to pass through the partitioning plate 3 in a thickness direction and extend in a longitudinal direction of the partitioning plate 3.

The upper portion heatsink 10 and the lower portion heatsink 11 are each formed into an approximately rectangular flat shape using a material that has good thermal conductivity such as aluminum, copper, AlSiC, etc., and radiating fins 12 are disposed so as to stand on rear surfaces thereof. The radiating fins 12 are cylindrical bodies that are disposed so as to stand perpendicularly on rear surfaces of the upper portion heatsink 10 and the lower portion heatsink 11. As shown in FIG. 3, a plurality of rows of radiating fins 12 that are arranged at a predetermined pitch in longitudinal directions of the upper portion heatsink 10 and the lower portion heatsink 11 are arranged so as to have a predetermined spacing in width directions of the upper portion heatsink 10 and the lower portion heatsink 11 so as to be offset by a half pitch in the longitudinal directions of the upper portion heatsink 10 and the lower portion heatsink 11 so as to be disposed in matrix patterns on the rear surfaces of the upper portion heatsink 10 and the lower portion heatsink 11.

To assemble a cooling apparatus 100 that is configured in this manner, a rear surface side of the upper portion heatsink 10 is first stacked on the main body portion 2 from an upper portion side, so as to interpose a sealing member, if required. A rear surface side of the lower portion heatsink 11 is stacked on the main body portion 2 from a lower portion side, so as to interpose a sealing member, if required. The main body portion 2 and the upper portion and lower portion heatsinks 10 and 11 are then fixed, and the water jacket 1 and the upper portion and lower portion heatsinks 10 and 11 are linked and integrated to assemble the cooling apparatus 100.

In this cooling apparatus 100, the upper portion heatsink 10 covers an upper portion opening of the main body portion 2, and the lower portion heatsink 11 covers a lower portion opening of the main body portion 2. An upper portion space is formed by the main body portion 2, the partitioning plate 3, and the upper portion heatsink 10, and a lower portion space is formed by the main body portion 2, the partitioning plate 3, and the lower portion heatsink 11.

The liquid coolant distributing structural body 8 contacts the rear surface of the upper portion heatsink 10 such that a liquid coolant supplying header 4 is formed by the liquid coolant supplying groove 4a and the upper portion heatsink 10 in a central portion in the width direction of the upper portion space. A flow channel cross-sectional area of this liquid coolant supplying header 4 becomes gradually smaller from near a first end of the liquid coolant supplying header 4 toward a second end. A liquid coolant discharging header 5 is formed by the liquid coolant discharging groove 5a and the lower portion heatsink 11 in a central portion in the width direction of the lower portion space. A flow channel cross-sectional area of this liquid coolant discharging header 5 is constant from near the first end of the liquid coolant supplying header 4 toward the second end. As shown in FIG. 7, an inflow direction and a discharging direction of the liquid coolant are identical directions. In addition, groups of the radiating fins 12 of the upper portion and lower portion heatsinks 10 and 11 are respectively housed inside the upper portion space and the lower portion space so as to avoid the liquid coolant supplying header 4, the liquid coolant discharging header 5, and the vertical flow channels 9, forming cooling flow channels.

In a cooling apparatus 100 that is configured in this manner, the heat-generating elements 15 are fixed by metallic bond, grease, adhesion, etc., onto the respective front surfaces of the upper portion and lower portion heatsinks 10 and 11 so as to line up in a flow channel direction of the liquid coolant supplying header 4. As indicated by the arrows in FIG. 5, liquid coolant that is supplied from a pump, etc., (not shown) flows in through the liquid coolant supplying port 6 toward the first end of the liquid coolant supplying header 4, and flows through the liquid coolant supplying header 4 along the liquid coolant distributing structural body 8 toward the second end. The direction of flow of the liquid coolant is then changed to the width direction of the water jacket 1 by the liquid coolant distributing structural body 8 so as to flow into the groups of radiating fins 12 that are housed inside the upper portion space.

The rows of adjacent radiating fins 12 in the groups of radiating fins 12 are offset by a half pitch in the longitudinal direction of the water jacket 1. Thus, the liquid coolant meanders through the groups of radiating fins 12 while flowing toward the vertical flow channels 9. At this point, the heat that is generated by the heat-generating elements 15 that are mounted onto the upper portion heatsink 10 is radiated to the liquid coolant by means of the radiating fins 12.

Next, as indicated by the arrows in FIG. 4, the liquid coolant that has flowed into the vertical flow channels 9 flows through the vertical flow channels 9 toward the lower portion of the water jacket 1, and flows into the groups of radiating fins 12 that are housed inside the lower portion space. As indicated by the arrows in FIG. 6, the liquid coolant meanders through the groups of radiating fins 12 while flowing toward the liquid coolant discharging header 5. At this point, the heat that is generated by the heat-generating elements 15 that are mounted onto the lower portion heatsink 11 is radiated to the liquid coolant by means of the radiating fins 12. The liquid coolant that has flowed into the liquid coolant discharging header 5 then flows through the liquid coolant discharging header 5 toward the second end, and is discharged through the liquid coolant discharging port 7.

In a cooling apparatus 100 that is configured in this manner, cooling flow channels are constituted by: flow channels that extend from a liquid coolant supplying header 4 that extends longitudinally on a central portion in a width direction of an upper portion side to vertical flow channels 9 that extend longitudinally on first and second end portions in the width direction; and flow channels that extend from the vertical flow channels 9 to a liquid coolant discharging header 5 that extends longitudinally on a central portion in a width direction of a lower portion side. Thus, if there are differences in the generated heat density of the heat-generating elements 15, it is preferable to mount the heat-generating elements 15 that have greater generated heat density onto the upper portion heatsink 10, and to mount the heat-generating elements 15 that have less generated heat density onto the lower portion heatsink 11. In other words, because the heat-generating elements 15 that have greater generated heat density are constantly cooled by liquid coolant from the liquid coolant supplying header 4 that is in a sufficiently cooled state that has not risen in temperature, the heat-generating elements 15 that have greater generated heat density can be cooled efficiently.

According to Embodiment 1, the flow velocity upstream from the liquid coolant supplying header 4 is slower than the flow velocity downstream due to inertial force of the liquid coolant inside the liquid coolant supplying header 4, but because the flow channel cross-sectional area of the liquid coolant supplying header 4 becomes gradually smaller from near the first end of the liquid coolant supplying header 4 toward the second end, the flow rate of the liquid coolant that flows from the liquid coolant supplying header 4 into the groups of radiating fins 12 inside the upper portion space is made uniform in the flow channel direction of the liquid coolant supplying header 4 (the longitudinal direction of the water jacket 1). The liquid coolant in which flow rate has been made uniform in the longitudinal direction of the water jacket 1 then flows into the groups of radiating fins 12 inside the lower portion space via the vertical flow channels 9.

Thus, because the liquid coolant that flows through the liquid coolant supplying header 4 flows into the groups of radiating fins 12 uniformly in the flow channel direction of the liquid coolant supplying header 4, the flow rate of the liquid coolant that flows into the groups of radiating fins 12 is made uniform in the flow channel direction of the liquid coolant supplying header 4. Thus, the cooling performance of the cooling apparatus 100 can be made uniform in the flow channel direction of the liquid coolant supplying header 4, enabling the occurrence of irregularities in cooling performance among the heat-generating elements 15 that are mounted in parallel onto the front surfaces of the upper portion and lower portion heatsinks 10 and 11 to be suppressed.

In addition, because the bottom surface of the liquid coolant distributing structural body 8 that is disposed inside the liquid coolant supplying groove 4a is configured into a triangular prism that is an isosceles triangle, the two side surfaces of the liquid coolant distributing structural body 8 are inclined relative to the direction of flow of the liquid coolant that flows through the liquid coolant supplying header 4, changing the direction of flow of the liquid coolant from the longitudinal direction of the water jacket 1 to the width direction. Thus, because the liquid coolant that flows through the liquid coolant supplying header 4 flows into the groups of radiating fins 12 smoothly, cooling performance is improved.

Because the rows of adjacent radiating fins 12 in the groups of radiating fins 12 are offset by a half pitch in the longitudinal direction of the water jacket 1, the liquid coolant meanders through the groups of radiating fins 12 while flowing from the liquid coolant supplying header 4 toward the vertical flow channels 9, and also from the vertical flow channels 9 toward the liquid coolant discharging header 5. Consequently, because the cooling flow channels that extend from the liquid coolant supplying header 4 to the liquid coolant discharging header 5 are lengthened, and the heat radiating area of the radiating fins 12 is increased, cooling performance is improved.

Because the partitioning plate 3 is constituted by a resin-molded body, the lower portion heatsink 11 is separated from the upper portion heatsink 10 thermally. Thus, problems such as heat generated in the heat-generating elements 15 that are mounted onto the upper portion heatsink 10 (or the lower portion heatsink 11) being transferred to the heat-generating elements 15 that are mounted onto the lower portion heatsink 11 (or the upper portion heatsink 10), and increasing the temperature of the heat-generating elements 15 that are mounted onto the lower portion heatsink 11 (or the upper portion heatsink 10), etc., are stopped preemptively.

Because the water jacket 1 is constituted by a resin-molded body, the main body portion 2, the partitioning plate 3, the liquid coolant supplying port 6, and the liquid coolant discharging port 7 are formed integrally. Thus, manufacturing time can be shortened and cost reductions can be achieved compared to when the main body portion 2, the partitioning plate 3, the liquid coolant supplying port 6, and the liquid coolant discharging port 7 are produced as separate members and the water jacket 1 is produced by assembly in a subsequent step.

The partitioning plate 3 is disposed so as to divide an internal portion of the main body portion 2 into two sections in the thickness direction, the cooling flow channels that extend from the liquid coolant supplying header 4 to the liquid coolant discharging header 5 are formed into two (upper and lower) layers, and the flow channels in the two upper and lower layers are connected in series by means of the vertical flow channels 9. Thus, because the cooling flow channels that extend from the liquid coolant supplying header 4 to the liquid coolant discharging header 5 can be lengthened and the heat radiating area of the radiating fins 12 can be increased without increasing the cooling apparatus 100 in size, cooling performance is improved.

Figure 8:
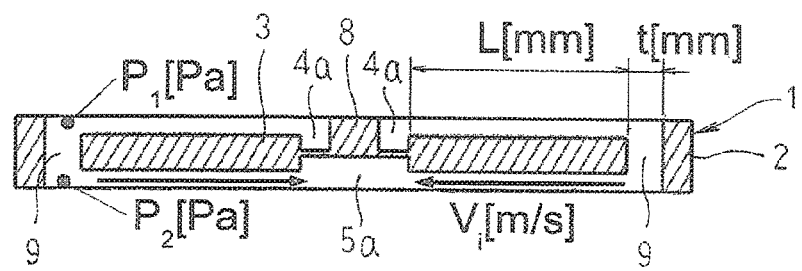
FIG. 8 is a diagram that explains an operating principle of the cooling apparatus according to the present invention.
Figure 9:
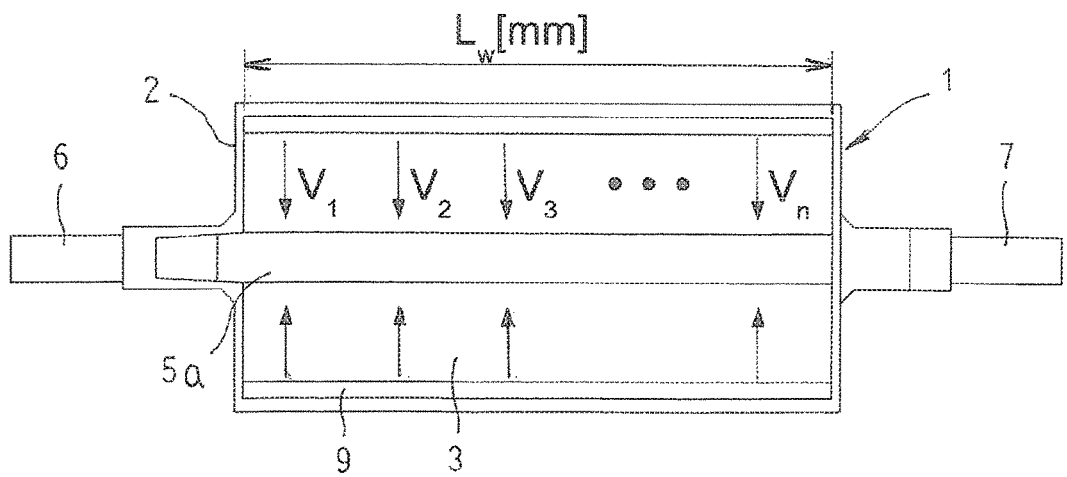
FIG. 9 is a diagram that explains the operating principle of the cooling apparatus according to the present invention.

Next, a width t of the vertical flow channels 9 will be investigated. FIGS. 8 and 9 are diagrams that explain an operating principle of the cooling apparatus according to the present invention, FIG. 8 being a cross section that is cut in a plane that is perpendicular to the direction of flow of a liquid coolant inside a liquid coolant supplying header that shows a state in which upper portion and lower portion heatsinks of a cooling apparatus are removed, and FIG. 9 being a plan that is viewed from a lower portion side that shows a state in which the lower portion heatsink of the cooling apparatus is removed, respectively. Moreover, L (mm) is a width of a fin region, and $L_w$ (mm) is a length of the fin region. Here, the fin region is a region that is surrounded by two inner wall surfaces of the main body portion 2 of the partitioning plate 3 in the longitudinal direction, the liquid coolant supplying groove 4a, and the vertical flow channels 9. $P_1$ (Pa) is an inlet pressure of the vertical flow channels 9, and $P_2$ (Pa) is an outlet pressure of the vertical flow channels 9. In addition, a lower portion fin region is divided into n regions in the longitudinal direction, and $V_1$ through $V_n$ are flow velocities of the liquid coolant in the respective regions.

Now, if the width t (mm) of the vertical flow channels 9 is widened too much, the liquid coolant is biased toward the second end of the vertical flow channels 9 (near the liquid coolant discharging port 7) in the process of passing through the vertical flow channels 9, making irregularities more likely to arise in the flow of the liquid coolant. This is because when the width t (mm) of the vertical flow channels 9 is wide, flow channel resistance in the longitudinal direction of the vertical flow channels 9 is reduced. Thus, in order to make heat radiating performance within the planes of the upper portion heatsink 10 and the lower portion heatsink 11 of the cooling apparatus 1 uniform, it is desirable to make the width t (mm) of the vertical flow channels 9 narrower to reduce flow velocity irregularity.

If the width t (mm) of the vertical flow channels 9 is made too narrow, on the other hand, the difference between the inlet pressure $P_1$ (Pa) of the vertical flow channels 9 and the outlet pressure $P_2$ (Pa) of the vertical flow channels 9, i.e., pressure loss, is increased, and a lot of energy is required to drive the pump that circulates the liquid coolant. Thus, it is desirable to widen the width t (mm) of the vertical flow channels 9 to reduce energy consumption.

First, as shown in FIGS. 8 and 9, flow velocity irregularity D of the liquid coolant is defined by Expression (1), where the lower portion fin region is divided into n regions in the longitudinal direction, and $V_{average}$ is the average flow velocity of flow velocities $V_1$ through $V_n$ of the liquid coolant in the respective regions, and σ is the standard deviation of the flow velocity distribution.

$$D = \frac{\sigma}{V_{average}} \quad (1)$$

Now, as a result of performing fluid simulations with different numbers of sections n, it was confirmed that the average flow velocity $V_{average}$ and the flow velocity irregularity D are approximately constant when n is greater than or equal to 5.

Figure 10:
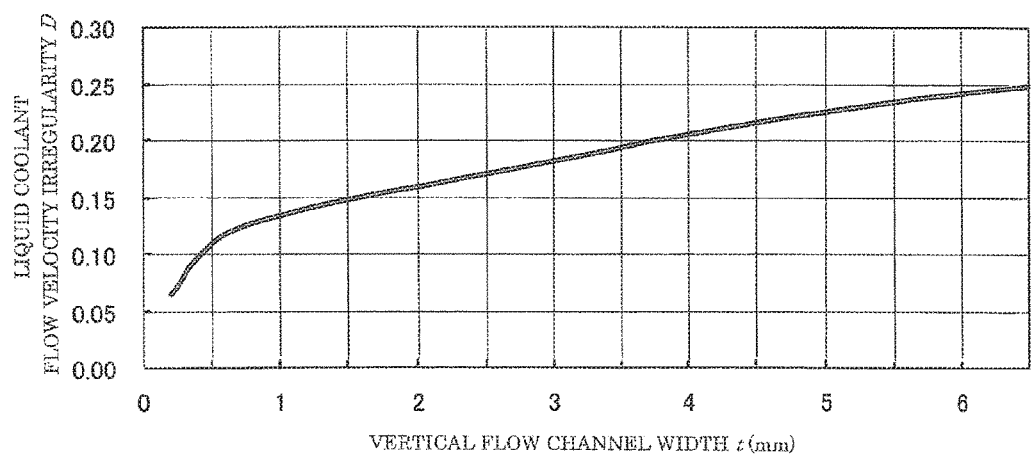
FIG. 10 is a graph that shows a relationship between flow velocity irregularity and vertical flow channel width in the cooling apparatus according to the present invention.

Next, results of performing fluid simulations for flow velocity irregularity D with different widths t (mm) in the vertical flow channels 9 are shown in FIG. 10.

From FIG. 10, it can be seen that the flow velocity irregularity D increases rapidly when the width t (mm) of the vertical flow channels 9 is increased from 0.2 mm, and increases gently when the width t (mm) exceeds 0.5 mm. Now, to make heat radiating performance within the planes of the upper portion heatsink 10 and the lower portion heatsink 11 of the cooling apparatus 1 uniform, it is desirable to set the flow velocity irregularity D to less than or equal to 0.25 (25 percent). From FIG. 10, the width t (mm) of the vertical flow channels 9 at which the flow velocity irregularity D is less than or equal to 0.25 is 6.5 mm. Consequently, from the viewpoint of making the heat radiating performance uniform, it is desirable to set the width t (mm) of the vertical flow channels 9 to less than or equal to 6.5 mm.

As the width t (mm) of the vertical flow channels 9 approaches 0 mm, flow velocity irregularity D is reduced, but pressure loss increases, increasing energy consumption by the pump that cycles the liquid coolant. Generally, because pressure loss is proportional to the square of the flow velocity according to Bernoulli's equation, it is defined by Expression (2), where this proportionality constant is set to a pressure loss coefficient ζ. Moreover, ρ in Expression (2) is the density of the liquid coolant.

$$\xi = \frac{P_2 - P_1}{\rho \cdot V_{average}^2} \quad (2)$$

The smaller the value of ζ the lower the pressure loss, reducing energy consumption of the pump that cycles the liquid coolant. Since the pressure loss coefficient ζ and the flow velocity irregularity D should each be as small as possible, the inverse of the product of ζ and D should be as large as possible. The inverse of the product of ζ and D is defined by Expression (3), where O is optimality.

$$O = \frac{1}{\xi \cdot D} \quad (3)$$

Figure 11:
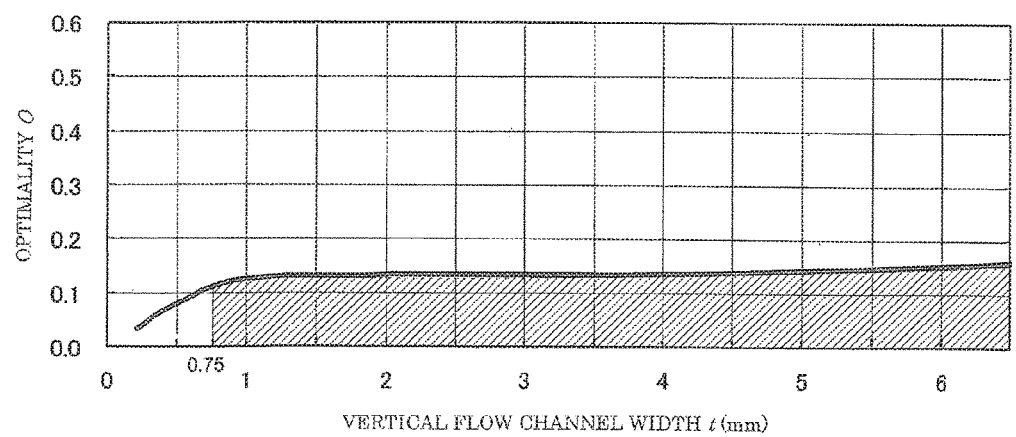
FIG. 11 is a graph that shows a relationship between optimality and vertical flow channel width in the cooling apparatus according to the present invention.

Next, results of performing fluid simulations for optimality O with different widths t (mm) in the vertical flow channels 9 are shown in FIG. 11. From FIG. 11, it can be seen that optimality O decreases rapidly when the width t (mm) of the vertical flow channels 9 is less than 0.75 (mm), and is at an approximately constant value at greater than or equal to 0.75 (mm). Consequently, from the viewpoint of reducing energy consumption, it is desirable to set the width t (mm) of the vertical flow channels 9 to greater than or equal to 7.5 mm.

Generally, flow is similar if the Reynolds number is an equal value. Here, the Reynolds number is defined as Re=$V_{average} \cdot L_w / \nu$, and as a result of performing fluid simulations, it was confirmed that the relationship between flow velocity irregularity D and the width t of the vertical flow channels 9 that is shown in FIG. 10 and the relationship between optimality O and the width t of the vertical flow channels 9 that is shown in FIG. 11 are satisfied under conditions in which Re≤$10^6$. Here, $L_w$ (m) is a longitudinal length of the fin regions, and ν ($m^2/s$) is a coefficient of kinematic viscosity of the liquid coolant.

From the above, it is desirable to set the width t of the vertical flow channels 9 so as to satisfy 0.75 (mm)≤t≤6.5 (mm). That is, flow velocity irregularity D and pressure loss can be reduced if the width t of the vertical flow channels 9 satisfies 0.75 (mm)≤t≤6.5 (mm). Heat radiating performance within the planes of the upper portion heatsink 10 and the lower portion heatsink 11 of the cooling apparatus 1 can thereby be made uniform, and energy consumption of the pump that cycles the liquid coolant can also be reduced. Moreover, the optimal conditions of the width t of the vertical flow channels 9 (0.75 (mm)≤t≤6.5 (mm)) are invariably satisfied if Re≤$10^6$, irrespective of the value of $L_w$ and v.

Moreover, in Embodiment 1 above, a main body portion, a partitioning plate, a liquid coolant supplying port, and a liquid coolant discharging port are formed integrally, but a main body portion and a partitioning plate may also be formed integrally, and a liquid coolant supplying port and a liquid coolant discharging port mounted in a subsequent step.

Embodiment 2

Figure 12:
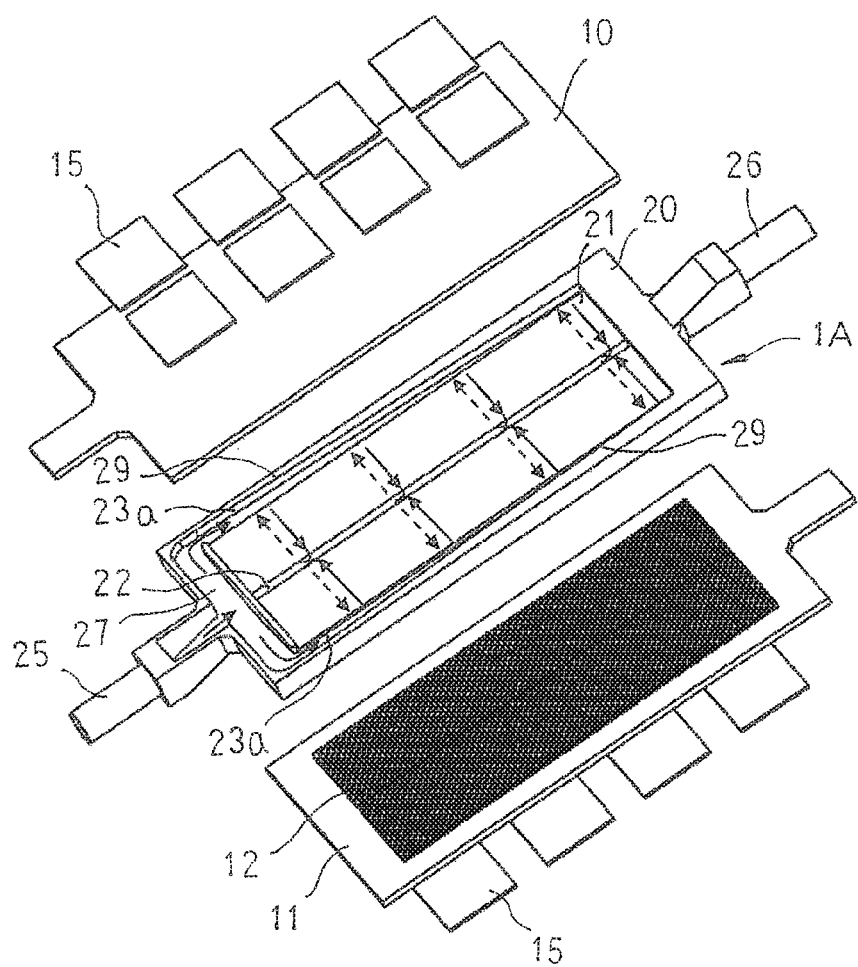
FIG. 12 is an exploded perspective that explains a configuration of a cooling apparatus according to Embodiment 2 of the present invention.
Figure 13:
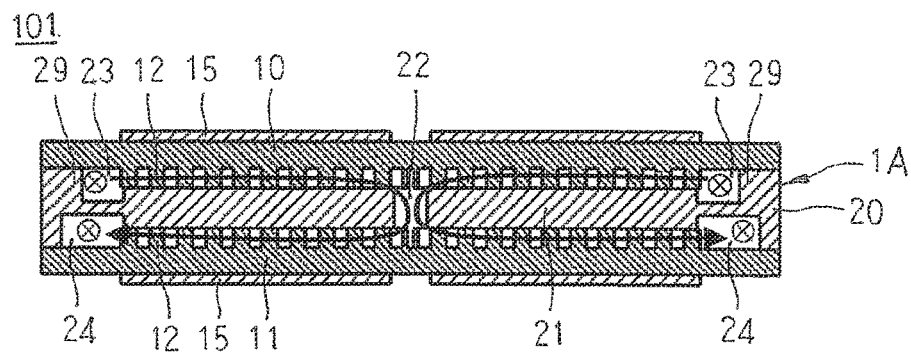
FIG. 13 is a cross section in which the cooling apparatus according to Embodiment 2 of the present invention is cut in a plane that is perpendicular to a direction of flow of a liquid coolant at an inflow header.
Figure 14:
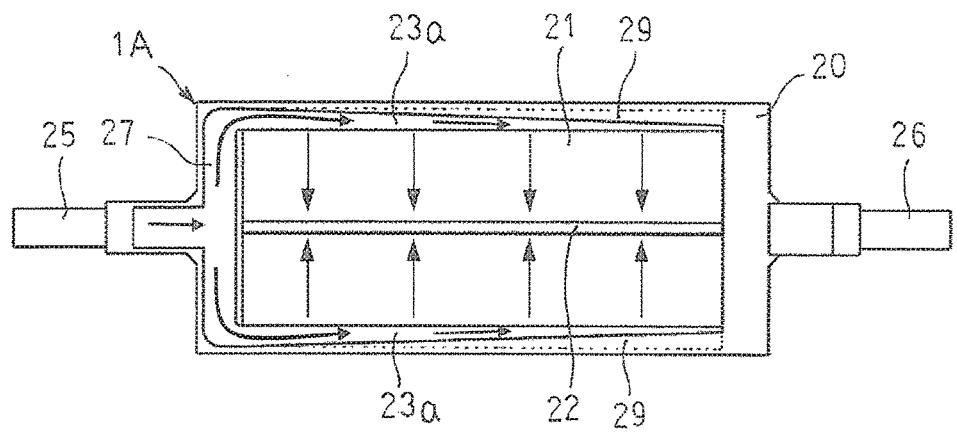
FIG. 14 is a plan that is viewed from an upper portion side that shows a state of the cooling apparatus according to Embodiment 2 of the present invention in which an upper portion heatsink is removed.
Figure 15:
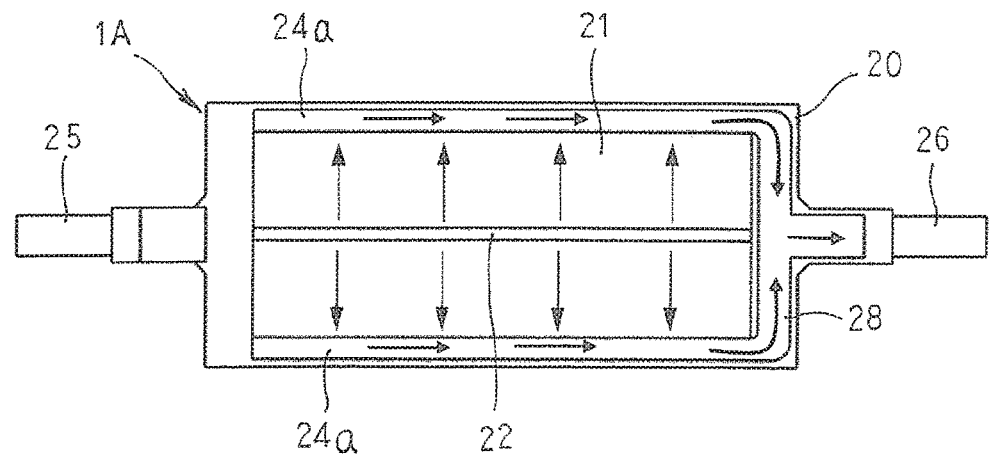
FIG. 15 is a plan that is viewed from a lower portion side that shows a state of the cooling apparatus according to Embodiment 2 of the present invention in which a lower portion heatsink is removed.

FIG. 12 is an exploded perspective that explains a configuration of a cooling apparatus according to Embodiment 2 of the present invention, FIG. 13 is a cross section in which the cooling apparatus according to Embodiment 2 of the present invention is cut in a plane that is perpendicular to a direction of flow of a liquid coolant at an inflow header, FIG. 14 is a plan that is viewed from an upper portion side that shows a state of the cooling apparatus according to Embodiment 2 of the present invention in which an upper portion heatsink is removed, and FIG. 15 is a plan that is viewed from a lower portion side that shows a state of the cooling apparatus according to Embodiment 2 of the present invention in which a lower portion heatsink is removed. Moreover, in FIGS. 12 through 15, arrows represent liquid coolant flow.

In FIGS. 12 through 15, a water jacket 1A is a resin-molded body that is formed using a polyphenylene sulfide (PPS) resin, for example, and includes: a rectangular frame-shaped main body portion 20 that has a predetermined thickness; a partitioning plate 21 that is formed so as to have a flat, rectangular shape that has a thickness that is thinner than that of the main body portion 20, that is linked to a central portion of an inner circumferential surface of the main body portion 20 in a thickness direction, and that is disposed so as to divide an internal portion of the main body portion 20 into two sections in the thickness direction; a vertical flow channel 22 that is formed over an entire longitudinal region of a central portion in a width direction of the partitioning plate 21 so as to pass through the partitioning plate 21 in a thickness direction and extend in a longitudinal direction of the partitioning plate 21; liquid coolant supplying grooves 23a that are respectively formed so as to extend longitudinally on the partitioning plate 21 over entire longitudinal regions of two end portions in a width direction of an upper surface of the partitioning plate 21; liquid coolant discharging grooves 24a that are respectively formed so as to extend longitudinally on the partitioning plate 21 over entire longitudinal regions of two end portions in a width direction of a lower surface of the partitioning plate 21; a liquid coolant supplying port 25 that is linked to a first longitudinal end of the main body portion 20; a liquid coolant discharging port 26 that is linked to a second longitudinal end of the main body portion 20; a supply-side communicating passage 27 that is formed near a first end of an upper surface of the main body portion 20 so as to connect the liquid coolant supplying port 25 and first ends of the liquid coolant supplying grooves 23a; and a discharge-side communicating passage 28 that is formed near a second end of a lower surface of the main body portion 20 so as to connect the liquid coolant discharging port 26 and second ends of the liquid coolant discharging grooves 24a.

In addition, liquid coolant distributing structural bodies 29 are disposed so as to project from bottom surfaces of the liquid coolant supplying grooves 23a so as to extend from near first ends of the liquid coolant supplying grooves 23a to second ends such that widths widen gradually from near the first ends of the liquid coolant supplying grooves 23a toward the second ends. In this case, as shown in FIG. 14, bottom surfaces of the liquid coolant distributing structural bodies 29 are configured into triangular prisms that are right-angled triangles, and are formed integrally on two side portions of the main body portion 20 in the width direction. The liquid coolant supplying grooves 23a are thereby configured such that groove cross-sectional areas thereof become gradually smaller from near the first ends of the liquid coolant supplying grooves 23a toward the second ends. Groove cross-sectional areas of the liquid coolant discharging grooves 24a, on the other hand, are constant from near the first ends of the liquid coolant supplying grooves 23a toward the second ends.

Moreover, a cooling apparatus 101 according to Embodiment 2 is configured in a similar or identical manner to that of the cooling apparatus 100 according to Embodiment 1 above except that the water jacket 1A is used instead of the water jacket 1.

To assemble a cooling apparatus 101 that is configured in this manner, a rear surface side of the upper portion heatsink 10 is first stacked on the main body portion 20 from an upper portion side, so as to interpose a sealing member, if required. A rear surface side of the lower portion heatsink 11 is stacked on the main body portion 20 from a lower portion side, so as to interpose a sealing member, if required. The main body portion 20 and the upper portion and lower portion heatsinks 10 and 11 are then fixed, and the water jacket 1A and the upper portion and lower portion heatsinks 10 and 11 are linked and integrated to assemble the cooling apparatus 101.

In this cooling apparatus 101, the upper portion heatsink 10 covers an upper portion opening of the main body portion 20, and the lower portion heatsink 11 covers a lower portion opening of the main body portion 20. An upper portion space is formed by the main body portion 20, the partitioning plate 21, and the upper portion heatsink 10, and a lower portion space is formed by the main body portion 20, the partitioning plate 21, and the lower portion heatsink 11.

The liquid coolant distributing structural bodies 29 contact the rear surface of the upper portion heatsink 10 such that liquid coolant supplying headers 23 are formed by the liquid coolant supplying grooves 23a and the upper portion heatsink 10 on two end portions in the width direction of the upper portion space. Flow channel cross-sectional areas of these liquid coolant supplying headers 23 become gradually smaller from near first ends of the liquid coolant supplying headers 23 toward second ends. Liquid coolant discharging headers 24 are formed by the liquid coolant discharging grooves 24a and the lower portion heatsink 11 on two end portions in the width direction of the lower portion space. Flow channel cross-sectional areas of these liquid coolant discharging headers 24 are constant from near the first ends of the liquid coolant supplying headers 23 toward the second ends. In addition, groups of the radiating fins 12 of the upper portion and lower portion heatsinks 10 and 11 are respectively housed inside the upper portion space and the lower portion space so as to avoid the liquid coolant supplying headers 23, the liquid coolant discharging headers 24, and the vertical flow channel 22, forming cooling flow channels.

In a cooling apparatus 101 that is configured in this manner, the heat-generating elements 15 are fixed by metallic bond, grease, adhesion, etc., onto the respective front surfaces of the upper portion and lower portion heatsinks 10 and 11 so as to line up in a flow channel direction of the liquid coolant supplying headers 23. As indicated by the arrows in FIG. 14, liquid coolant that is supplied from a pump, etc., (not shown) flows in through the liquid coolant supplying port 25 through the supply-side communicating passage 27 toward the first ends of the liquid coolant supplying headers 23, and flows through the liquid coolant supplying headers 23 along the liquid coolant distributing structural bodies 29 toward the second ends. The directions of flow of the liquid coolant are then changed to the width direction of the water jacket 1A by the liquid coolant distributing structural bodies 29 so as to flow into the groups of radiating fins 12 that are housed inside the upper portion space.

The liquid coolant meanders through the groups of radiating fins 12 while flowing toward the vertical flow channel 22. At this point, the heat that is generated by the heat-generating elements 15 that are mounted onto the upper portion heatsink 10 is radiated to the liquid coolant by means of the radiating fins 12.

Next, as indicated by the arrows in FIG. 13, the liquid coolant that has flowed into the vertical flow channel 22 flows through the vertical flow channel 22 toward the lower portion of the water jacket 1A, and flows into the groups of radiating fins 12 that are housed inside the lower portion space. As indicated by the arrows in FIG. 15, the liquid coolant meanders through the groups of radiating fins 12 while flowing toward the liquid coolant discharging headers 24. At this point, the heat that is generated by the heat-generating elements 15 that are mounted onto the lower portion heatsink 11 is radiated to the liquid coolant by means of the radiating fins 12. The liquid coolant that has flowed into the liquid coolant discharging headers 24 then flows through the liquid coolant discharging headers 24 toward the second end, passes through the discharge-side communicating passage 28, and is discharged through the liquid coolant discharging port 26.

In a cooling apparatus 101 that is configured in this manner, cooling flow channels are constituted by: flow channels that extend from liquid coolant supplying headers 23 that extend longitudinally on two side portions in a width direction of an upper portion side to a vertical flow channel 22 that extends longitudinally at a central portion in the width direction; and flow channels that extend from the vertical flow channel 22 to liquid coolant discharging headers 24 that extend longitudinally on two side portions in a width direction of a lower portion side. Thus, if there are differences in the generated heat density of the heat-generating elements 15, it is preferable to mount the heat-generating elements 15 that have greater generated heat density onto the upper portion heatsink 10, and to mount the heat-generating elements 15 that have less generated heat density onto the lower portion heatsink 11. In other words, because the heat-generating elements 15 that have greater generated heat density are constantly cooled by liquid coolant from the liquid coolant supplying headers 23 that is in a sufficiently cooled state that has not risen in temperature, the heat-generating elements 15 that have greater generated heat density can be cooled efficiently.

In Embodiment 2, because the flow channel cross-sectional area of the liquid coolant supplying headers 23 also becomes gradually smaller from near the first ends of the liquid coolant supplying headers 23 toward the second ends, the occurrence of irregularities in cooling performance among heat-generating elements 15 that are mounted onto the front surfaces of the upper portion and lower portion heatsinks 10 and 11 in parallel is suppressed, and cooling performance is also improved, in a similar manner to Embodiment 1 above.

Embodiment 3

Figure 16:
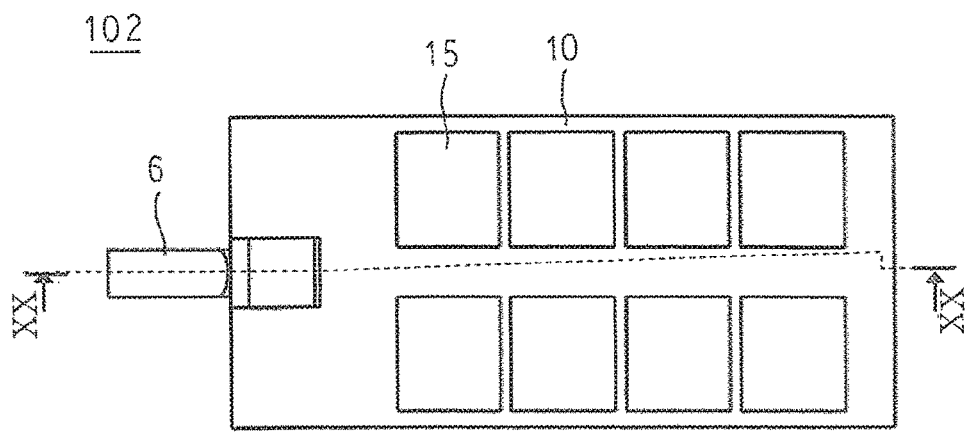
FIG. 16 is a plan that shows a cooling apparatus according to Embodiment 3 of the present invention.
Figure 17:
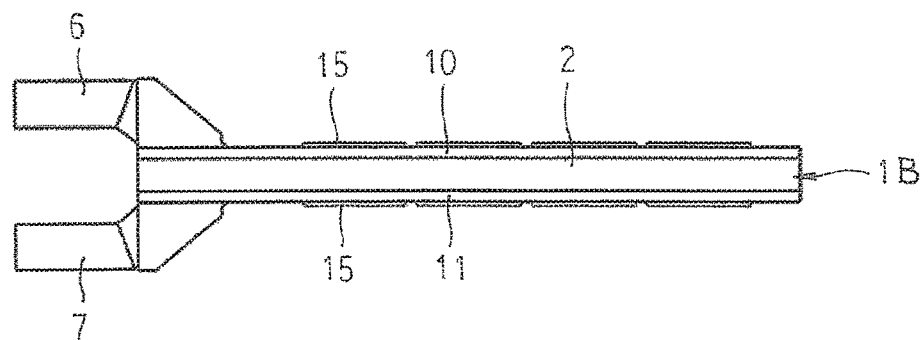
FIG. 17 is a side elevation that shows the cooling apparatus according to Embodiment 3 of the present invention.
Figure 18:
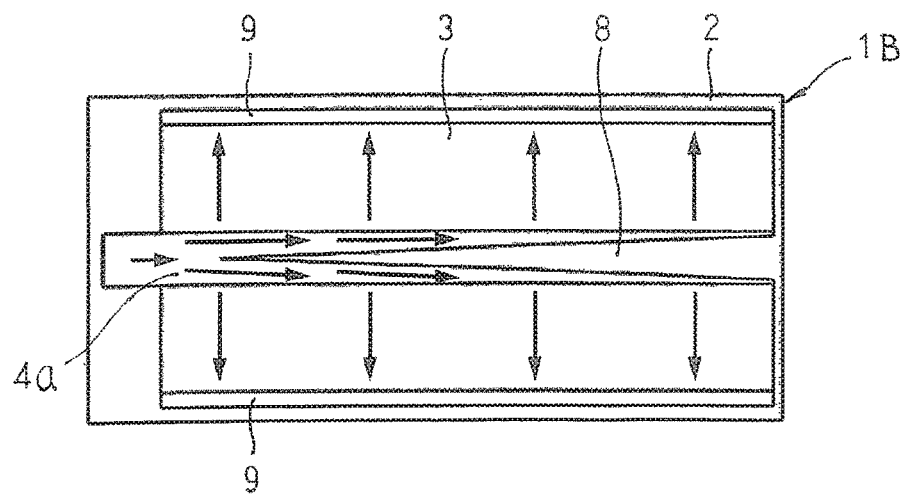
FIG. 18 is a plan that is viewed from an upper portion side that shows a state of the cooling apparatus according to Embodiment 3 of the present invention in which an upper portion heatsink is removed.
Figure 19:
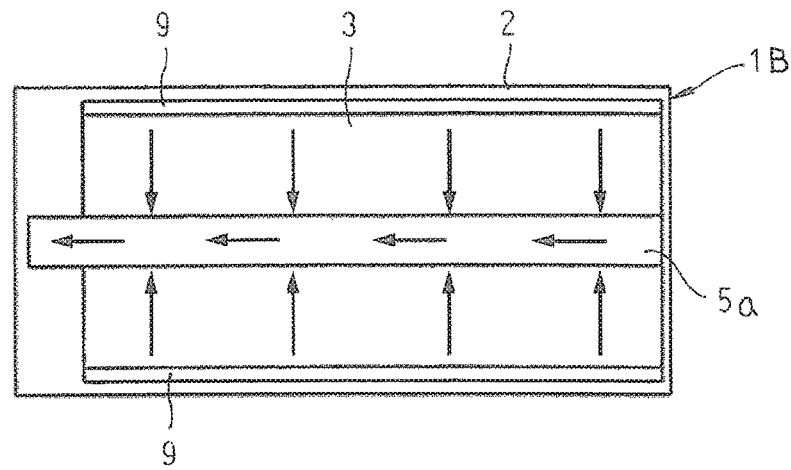
FIG. 19 is a plan that is viewed from a lower portion side that shows a state of the cooling apparatus according to Embodiment 3 of the present invention in which a lower portion heatsink is removed.
Figure 20:
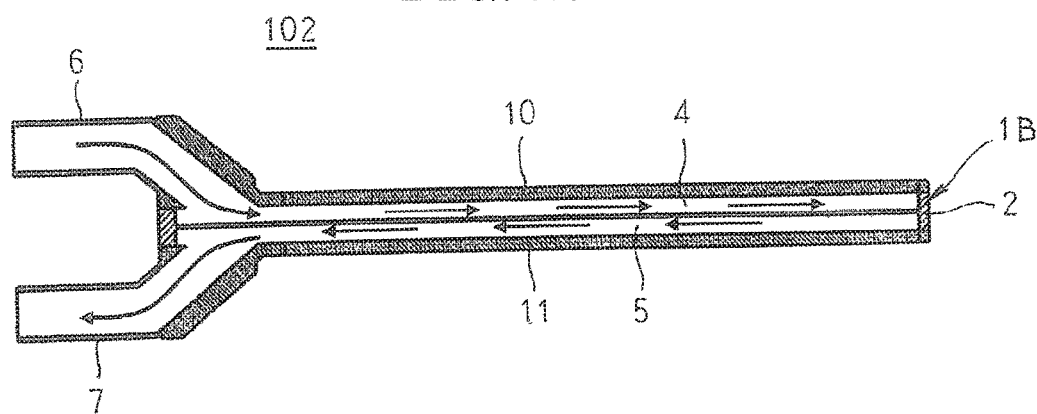
FIG. 20 is a cross section that is taken along Line XX-XX in FIG. 16 so as to be viewed in the direction of the arrows.

FIG. 16 is a plan that shows a cooling apparatus according to Embodiment 3 of the present invention, FIG. 17 is a side elevation that shows the cooling apparatus according to Embodiment 3 of the present invention, FIG. 18 is a plan that is viewed from an upper portion side that shows a state of the cooling apparatus according to Embodiment 3 of the present invention in which an upper portion heatsink is removed, FIG. 19 is a plan that is viewed from a lower portion side that shows a state of the cooling apparatus according to Embodiment 3 of the present invention in which a lower portion heatsink is removed, and FIG. 20 is a cross section that is taken along Line XX-XX in FIG. 16 so as to be viewed in the direction of the arrows. Moreover, in FIGS. 18 through 20, arrows represent liquid coolant flow.

In FIGS. 16 through 20, a water jacket 1B includes: a liquid coolant supplying port 6 that is linked near an upper portion at a first longitudinal end of a main body portion 2 so as to be connected to a first end of a liquid coolant supplying groove 4a; and a liquid coolant discharging port 7 that is linked near a lower portion at the first longitudinal end of the main body portion 2 so as to be connected to a first end of a liquid coolant discharging groove 5a.

Moreover, a cooling apparatus 102 according to Embodiment 3 is configured in a similar or identical manner to that of the cooling apparatus 100 according to Embodiment 1 above except that the water jacket 1B is used instead of the water jacket 1.

In a cooling apparatus 102 that is configured in this manner, the heat-generating elements 15 are fixed by metallic bond, grease, adhesion, etc., onto the respective front surfaces of the upper portion and lower portion heatsinks 10 and 11 so as to line up in a flow channel direction of the liquid coolant supplying header 4. As indicated by the arrows in FIG. 18, liquid coolant that is supplied from a pump, etc., (not shown) flows in from the liquid coolant supplying port 6 toward the first end of the liquid coolant supplying header 4, and flows through the liquid coolant supplying header 4 along the liquid coolant distributing structural body 8 toward the second end. The direction of flow of the liquid coolant is then changed to the width direction of the water jacket 1B by the liquid coolant distributing structural body 8 so as to flow into the groups of radiating fins 12 that are housed inside the upper portion space.

Thus, the liquid coolant meanders through the groups of radiating fins 12 while flowing toward the vertical flow channels 9. At this point, the heat that is generated by the heat-generating elements 15 that are mounted onto the upper portion heatsink 10 is radiated to the liquid coolant by means of the radiating fins 12.

Next, the liquid coolant that has flowed into the vertical flow channels 9 flows through the vertical flow channels 9 toward the lower portion of the water jacket 1B, and flows into the groups of radiating fins 12 that are housed inside the lower portion space. As indicated by the arrows in FIG. 19, the liquid coolant meanders through the groups of radiating fins 12 while flowing toward the liquid coolant discharging header 5. At this point, the heat that is generated by the heat-generating elements 15 that are mounted onto the lower portion heatsink 11 is radiated to the liquid coolant by means of the radiating fins 12. The liquid coolant that has flowed into the liquid coolant discharging header 5 then flows through the liquid coolant discharging header 5 toward the first end, and is discharged from the liquid coolant discharging port 7. Moreover, as shown in FIG. 20, an inflow direction and a discharging direction of the liquid coolant are opposite directions.

In a cooling apparatus 102 that is configured in this manner, cooling flow channels are constituted by: flow channels that extend from a liquid coolant supplying header 4 that extends longitudinally on a central portion in a width direction of an upper portion side to vertical flow channels 9 that extend longitudinally on first and second end portions in the width direction; and flow channels that extend from the vertical flow channels 9 to a liquid coolant discharging header 5 that extends longitudinally on a central portion in a width direction of a lower portion side. Thus, if there are differences in the generated heat density of the heat-generating elements 15, it is preferable to mount the heat-generating elements 15 that have greater generated heat density onto the upper portion heatsink 10, and to mount the heat-generating elements 15 that have less generated heat density onto the lower portion heatsink 11.

In Embodiment 3, because the flow channel cross-sectional area of the liquid coolant supplying header 4 also becomes gradually smaller from near the first end of the liquid coolant supplying header 4 toward the second end, the occurrence of irregularities in cooling performance among heat-generating elements 15 that are mounted onto the front surfaces of the upper portion and lower portion heatsinks 10 and 11 in parallel is suppressed, and cooling performance is also improved, in a similar manner to Embodiment 1 above.

According to Embodiment 3, because the liquid coolant supplying port 6 and the liquid coolant discharging port 7 are disposed on the first longitudinal end portion of the water jacket 1B, and the inflow direction and the discharging direction of the liquid coolant are opposite directions, that is, the direction of flow of the liquid coolant into the liquid coolant supplying header 4 and the direction of flow of the liquid coolant into the liquid coolant discharging header 5 are opposite directions, the inertial force of the liquid coolant on the upper portion side and the inertial force of the liquid coolant on the lower portion side are canceled out in the vertical flow channel 9, enabling bias of the liquid coolant that flows through the vertical flow channel 9 to be suppressed.

Embodiment 4

Figure 21:
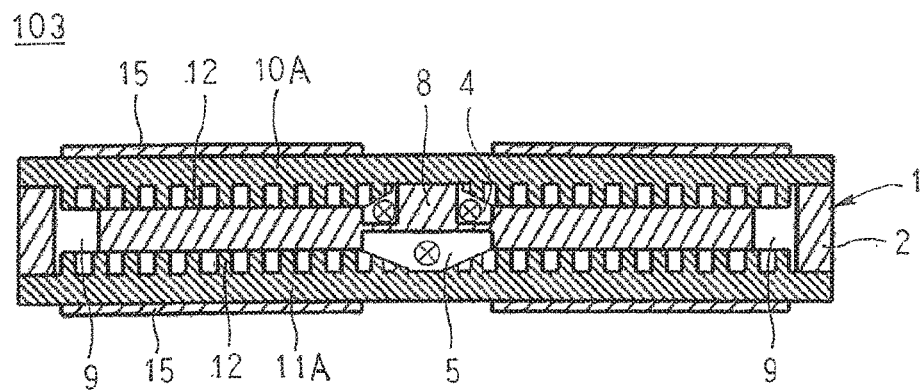
FIG. 21 is a cross section in which a cooling apparatus according to Embodiment 4 of the present invention is cut in a plane that is perpendicular to a direction of flow of a liquid coolant at an inflow header.

FIG. 21 is a cross section in which a cooling apparatus according to Embodiment 4 of the present invention is cut in a plane that is perpendicular to a direction of flow of a liquid coolant at an inflow header.

In FIG. 21, an upper portion heatsink 10A is formed so as to have a tapered shape in which heights of radiating fins 12 that are arranged in rows near a center in a width direction become gradually lower toward the center in the width direction. When the upper portion heatsink 10A is mounted onto an upper portion of a main body portion 2, the radiating fins 12 that are formed so as to have the tapered shape extend inside a liquid coolant supplying header 4. A lower portion heatsink 11A is formed so as to have a tapered shape in which heights of radiating fins 12 that are arranged in rows near a center in a width direction become gradually lower toward the center in the width direction. When the lower portion heatsink 11A is mounted onto a lower portion of the main body portion 2, the radiating fins 12 that are formed so as to have the tapered shape extend inside a liquid coolant discharging header 5.

Moreover, the rest of the configuration of a cooling apparatus 103 according to Embodiment 4 is configured in a similar or identical manner to that of the cooling apparatus 100 according to Embodiment 1 above.

In a cooling apparatus 103 that is configured in this manner, the radiating fins 12 are made to extend inside the liquid coolant supplying headers 4 and the liquid coolant discharging header 5 by lowering heights thereof into a tapered shape near the center in the width direction. Thus, because the heat radiating area of the radiating fins 12 can be expanded without reducing the flow channel cross-sectional area of the liquid coolant supplying headers 4 and the liquid coolant discharging header 5 excessively, heat generated in the heat-generating elements 15 can be radiated effectively.

Embodiment 5

Figure 22:
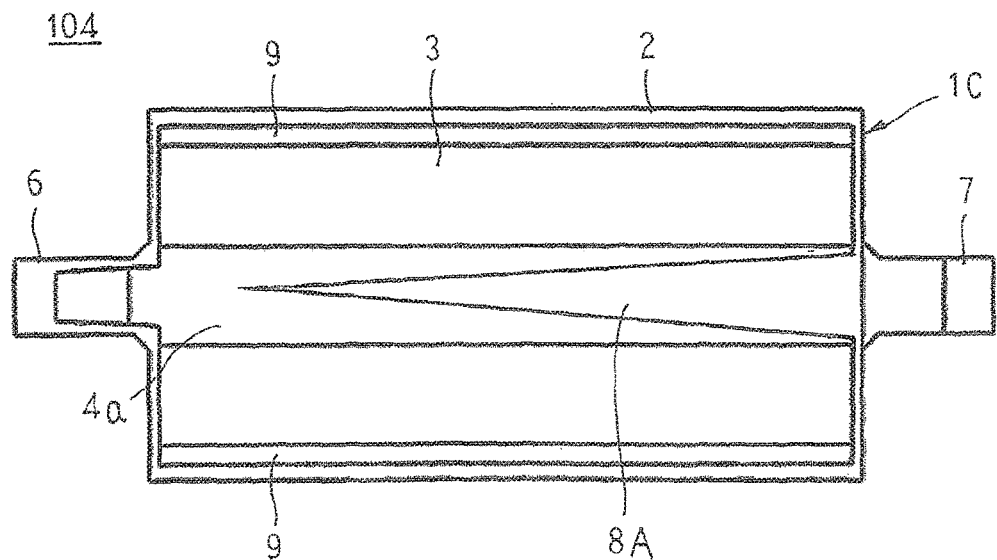
FIG. 22 is a plan that is viewed from an upper portion side that shows a state of a cooling apparatus according to Embodiment 5 of the present invention in which an upper portion heatsink is removed.

FIG. 22 is a plan that is viewed from an upper portion side that shows a state of a cooling apparatus according to Embodiment 5 of the present invention in which an upper portion heatsink is removed.

In FIG. 22, a liquid coolant distributing structural body 8A of a water jacket 1C is disposed so as to project from a bottom surface of the liquid coolant supplying groove 4*a* so as to extend from near a first end of the liquid coolant supplying groove 4*a* to a second end so as to have a predetermined height and such that a width widens gradually from near the first end of the liquid coolant supplying groove 4*a* toward the second end. In this case, a bottom surface of the liquid coolant distributing structural body 8A is configured into a triangular prism that is a scalene triangle.

Moreover, a cooling apparatus 104 according to Embodiment 5 is configured in a similar or identical manner to that of the cooling apparatus 100 according to Embodiment 1 above except that the water jacket 1C is used instead of the water jacket 1.

In a cooling apparatus 104 that is configured in this manner, because the flow channel cross-sectional area of the liquid coolant supplying header is configured so as to become gradually smaller from near the first end toward the second end, the flow rates of the liquid coolant flowing into each of the cooling flow channels on the two sides in the width direction of the liquid coolant supplying header are all equal in the flow channel direction of the liquid coolant supplying header. Because the angle of inclination of the two side surfaces of the liquid coolant distributing structural body 8A are different in the direction of flow of the liquid coolant that flows through the liquid coolant supplying header, the flow rates of the liquid coolant that flows into the cooling flow channels on the two sides in the width direction of the liquid coolant supplying header are different. Thus, in this cooling apparatus 104, four regions that have different cooling capacities can be configured on the two sides in the width direction of the upper portion heatsink 10 and the two sides in the width direction of the lower portion heatsink 11 by adjusting the angle of inclination of the two side surfaces of the liquid coolant distributing structural body 8A. In this case, the cooling capacity of the first side in the width direction of the liquid coolant supplying header (top of FIG. 22) is greater than the cooling capacity of the second side in the width direction of the liquid coolant supplying header (bottom of FIG. 22).

According to Embodiment 5, groups of heat-generating elements 15 that have different generated heat densities can be cooled effectively by mounting the group of heat-generating elements 15 that has the greatest generated heat density onto a region on the first side in the width direction side of the upper portion heatsink 10, mounting the group of heat-generating elements 15 that has the next greatest generated heat density onto a region on the second side in the width direction side of the upper portion heatsink 10, mounting the group of heat-generating elements 15 that has the next greatest generated heat density onto a region on the second side in the width direction side of the lower portion heatsink 11, and mounting the group of heat-generating elements 15 that has the least generated heat density onto a region on the first side in the width direction side of the lower portion heatsink 11.

Embodiment 6

Figure 23:
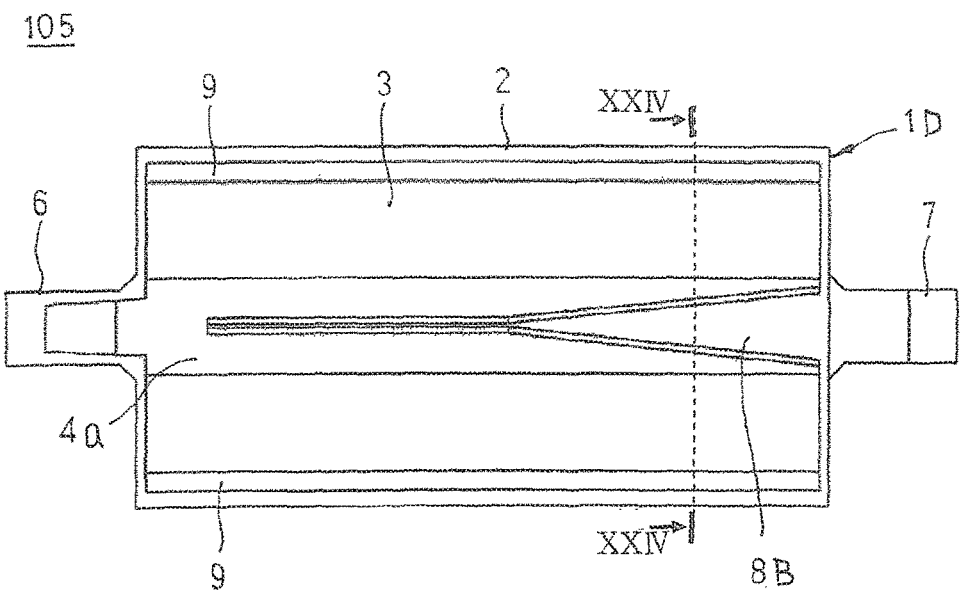
FIG. 23 is a plan that is viewed from an upper portion side that shows a state of a cooling apparatus according to Embodiment 6 of the present invention in which an upper portion heatsink is removed.
Figure 24:
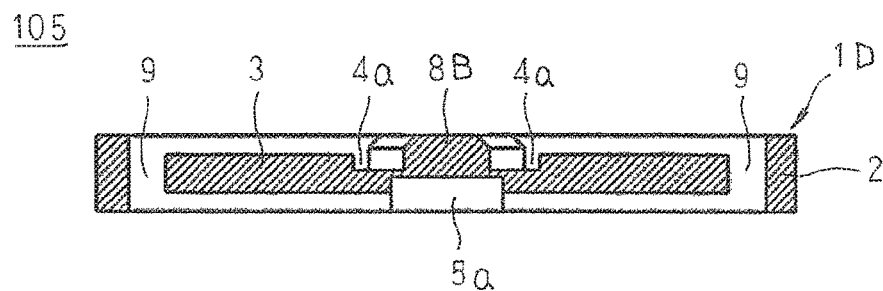
FIG. 24 is a cross section that is taken along Line XXIV-XXIV in FIG. 23 so as to be viewed in the direction of the arrows.

FIG. 23 is a plan that is viewed from an upper portion side that shows a state of a cooling apparatus according to Embodiment 6 of the present invention in which an upper portion heatsink is removed, and FIG. 24 is a cross section that is taken along Line XXIV-XXIV in FIG. 23 so as to be viewed in the direction of the arrows.

In FIGS. 23 and 24, a liquid coolant distributing structural body 8B of a water jacket 1D that has a predetermined height and that has a trapezoidal cross section perpendicular to the groove direction of the liquid coolant supplying groove 4a is disposed so as to project from a bottom surface of a liquid coolant supplying groove 4a such that a cross-sectional area is kept constant near a first end of the liquid coolant supplying groove 4a, and the cross-sectional area is subsequently increased gradually toward a second end.

Moreover, a cooling apparatus 105 according to Embodiment 6 is configured in a similar or identical manner to that of the cooling apparatus 100 according to Embodiment 1 above except that the water jacket 1D is used instead of the water jacket 1.

In a cooling apparatus 105 that is configured in this manner, the flow channel cross-sectional area near the first end (upstream end) of the liquid coolant supplying header is constant, and the flow channel cross-sectional area near the second end (downstream end) of the liquid coolant supplying header becomes gradually smaller toward the second end. In other words, because the flow channel cross-sectional area near the second end, where the inertial force of the liquid coolant inside the liquid coolant supplying header is largest, becomes gradually smaller toward the second end, the liquid coolant that flows through the liquid coolant supplying header flows into the groups of radiating fins 12 approximately uniformly in the flow channel direction of the liquid coolant supplying header.

Consequently, in Embodiment 6, the cooling performance of the cooling apparatus 105 can also be made uniform in the flow channel direction of the liquid coolant supplying header, enabling the occurrence of irregularities in cooling performance among the heat-generating elements 15 that are mounted onto the front surfaces of the upper portion and lower portion heatsinks 10 and 11 in parallel to be suppressed.

Embodiment 7

Figure 25:
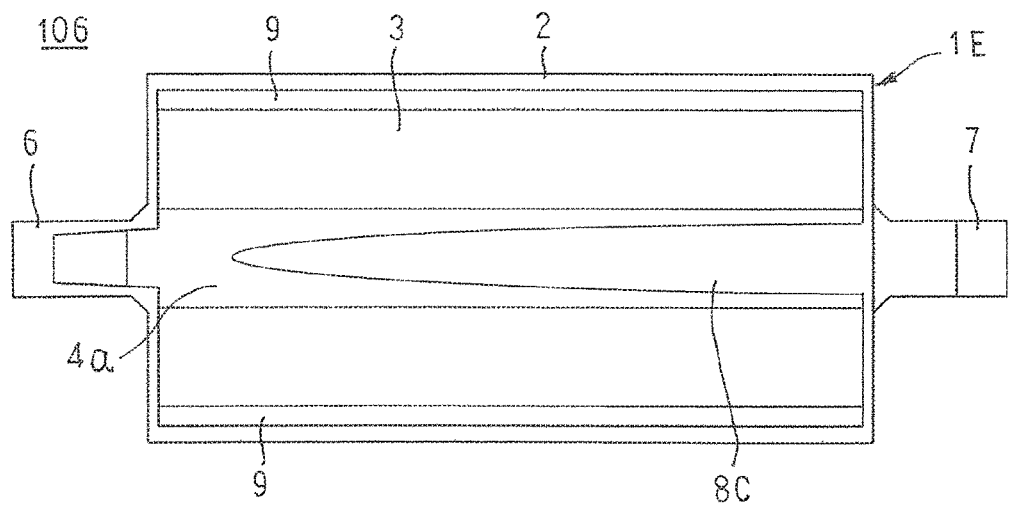
FIG. 25 is a plan that is viewed from an upper portion side that shows a state of a cooling apparatus according to Embodiment 7 of the present invention in which an upper portion heatsink is removed.

FIG. 25 is a plan that is viewed from an upper portion side that shows a state of a cooling apparatus according to Embodiment 7 of the present invention in which an upper portion heatsink is removed.

In FIG. 25, a liquid coolant distributing structural body 8C of a water jacket 1E is disposed so as to project from a bottom surface of the liquid coolant supplying groove 4a so as to extend from near a first end of the liquid coolant supplying groove 4a to a second end so as to have a predetermined height and such that a width widens gradually from near the first end of the liquid coolant supplying groove 4a toward the second end. In this case, a bottom surface of the liquid coolant distributing structural body 8C is configured into a prism in which two side surfaces are convex curved surfaces, and has plane symmetry relative to a plane that passes through center in a width direction of the liquid coolant supplying groove 4a. The liquid coolant supplying groove 4a is thereby configured such that a groove cross-sectional area thereof becomes gradually smaller from near the first end of the liquid coolant supplying groove 4a toward the second end.

Moreover, a cooling apparatus 106 according to Embodiment 7 is configured in a similar or identical manner to that of the cooling apparatus 100 according to Embodiment 1 above except that the water jacket 1E is used instead of the water jacket 1.

In a cooling apparatus 106 that is configured in this manner, because the flow channel cross-sectional area of the liquid coolant supplying header becomes gradually smaller from near the first end toward the second end, the liquid coolant that flows through the liquid coolant supplying header flows into the groups of radiating fins 12 approximately uniformly in the flow channel direction of the liquid coolant supplying header.

Consequently, in Embodiment 7, the cooling performance of the cooling apparatus 106 can also be made uniform in the flow channel direction of the liquid coolant supplying header, enabling the occurrence of irregularities in cooling performance among the heat-generating elements 15 that are mounted onto the front surfaces of the upper portion and lower portion heatsinks 10 and 11 in parallel to be suppressed.

Moreover, in Embodiment 7 above, side surfaces of the liquid coolant distributing structural body are formed into convex curved surfaces, but the side surfaces of the liquid coolant distributing structural body are not limited to convex curved surfaces and may also be concave curved surfaces, for example, provided that the flow channel cross-sectional area of the liquid coolant supplying header becomes gradually smaller from near the first end toward the second end.

Embodiment 8

Figure 26:
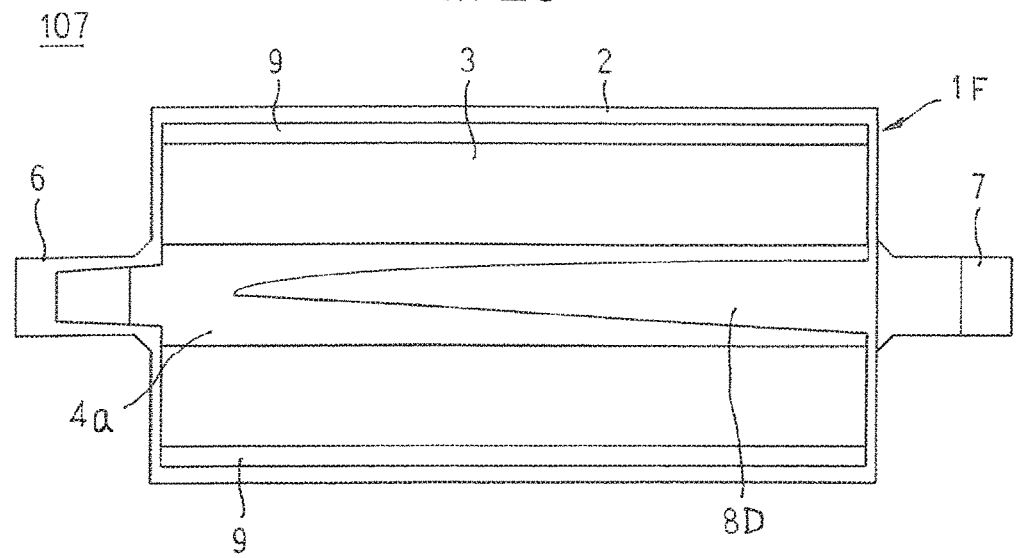
FIG. 26 is a plan that is viewed from an upper portion side that shows a state of a cooling apparatus according to Embodiment 8 of the present invention in which an upper portion heatsink is removed.

FIG. 26 is a plan that is viewed from an upper portion side that shows a state of a cooling apparatus according to Embodiment 8 of the present invention in which an upper portion heatsink is removed.

In FIG. 26, a liquid coolant distributing structural body 8D of a water jacket 1F is disposed so as to project from a bottom surface of the liquid coolant supplying groove 4a so as to extend from near a first end of the liquid coolant supplying groove 4a to a second end so as to have a predetermined height and such that a width widens gradually from near the first end of the liquid coolant supplying groove 4a toward the second end. In this case, the liquid coolant distributing structural body 8D is configured into a prism in which a first side surface is a convex curved surface, and a second side surface is a flat surface. The liquid coolant supplying groove 4a is thereby configured such that a groove cross-sectional area thereof becomes gradually smaller from near the first end of the liquid coolant supplying groove 4a toward the second end.

Moreover, a cooling apparatus 107 according to Embodiment 8 is configured in a similar or identical manner to that of the cooling apparatus 100 according to Embodiment 1 above except that the water jacket 1F is used instead of the water jacket 1.

In a cooling apparatus 107 that is configured in this manner, because the flow channel cross-sectional area of the liquid coolant supplying header becomes gradually smaller from near the first end toward the second end, the liquid coolant that flows through the liquid coolant supplying header flows into the groups of radiating fins 12 on the first side in the width direction of the liquid coolant supplying header uniformly, and flows into the groups of radiating fins 12 on the second side in the width direction of the liquid coolant supplying header uniformly, in the flow channel direction of the liquid coolant supplying header. Because the surface shapes of the two side surfaces of the liquid coolant distributing structural body 8D are different, the quantity of flow that flows into the groups of radiating fins 12 on the first side in the width direction of the liquid coolant supplying header and the quantity of flow that flows into the groups of radiating fins 12 on the second side in the width direction of the liquid coolant supplying header are different.

Consequently, in Embodiment 8, because four regions that have different cooling capacities can be configured on the two sides in the width direction of the upper portion heatsink 10 and the two sides in the width direction of the lower portion heatsink 11 by adjusting the surface shapes of the two side surfaces of the liquid coolant distributing structural body 8D, similar effects to those in Embodiment 5 above can also be achieved.

Moreover, in each of the above embodiments, the water jacket is made of a resin, but the material of the water jacket is not limited to a resin, and a metal such as aluminum, for example, may also be used.

It is not absolutely necessary to interpose a sealing member in order to link and integrate the upper portion heatsink 10 and the lower portion heatsink 11 to the main body portion 20, and these may also be sealed and joined so that the liquid coolant does not leak using an adhesive or welding, for example.

In each of the above embodiments, the radiating fins are formed so as to have a cylindrical shape, but the shape of the radiating fins is not limited to a cylinder, and may also be an elliptic cylinder, a rhombic prism, a rectangular prism, a flat plate shape, or a lamination of thin plates with slits, for example.

In each of the above embodiments, the radiating fins are disposed such that the liquid coolant meanders, but it is not absolutely necessary for the radiating fins to be disposed such that the liquid coolant meanders.

In each of the above embodiments, the liquid coolant has not been explained in detail, but a refrigerant such as water, oil, etc., can be used in the liquid coolant.

What is claimed is:

1. A cooling apparatus, comprising:
a main body portion that has upper and lower openings;
an upper portion heatsink and a lower portion heatsink that are mounted above and below said main body portion so as to cover said upper and lower openings of said main body portion;
a partitioning plate that is disposed so as to divide an internal portion space of said main body portion into upper and lower sections, so as to form an upper portion space with said upper portion heatsink, and so as to form a lower portion space with said lower portion heatsink;
a liquid coolant supplying header that is formed between one of said upper and lower portion heatsinks and said partitioning plate;
a liquid coolant discharging header that is formed between the other of said upper and lower portion heatsinks and said partitioning plate so as to have a flow channel direction that is parallel to a flow channel direction of said liquid coolant supplying header;
a vertical flow channel that is separated from said liquid coolant supplying header by a predetermined distance in a width direction that is perpendicular to said flow channel directions, that passes through said partitioning plate vertically, that extends at least parallel to said flow channel direction of said liquid coolant supplying header, and that communicates between said upper portion space and said lower portion space; and
a liquid coolant distributing structural body that is disposed inside said liquid coolant supplying header, extending from a first side of said internal portion space to a second side of said internal portion space opposite to said first side in a direction that is parallel to said partitioning plate, that is configured into a shape such that a flow channel cross-sectional area of said liquid coolant supplying header becomes gradually smaller from said first side of said internal portion space toward said second side of said internal portion space, and that distributes a liquid coolant that flows through said liquid coolant supplying header toward said vertical flow channel,
wherein the liquid coolant supplying header and the liquid coolant discharging header are two separate channels through which the liquid coolant flows, and
wherein a width t of said vertical flow channel satisfies $0.75 \text{ mm} \leq t \leq 6.5 \text{ mm}$.

2. A cooling apparatus according to claim 1, wherein said main body portion and said partitioning plate are configured into an integrated body.

3. A cooling apparatus according to claim 1, wherein said liquid coolant supplying header and said liquid coolant discharging header are disposed at a central portion in said width direction inside said main body portion, and two of said vertical flow channels are disposed on two sides in said width direction inside said main body portion.

4. A cooling apparatus according to claim 3, wherein, when said liquid coolant is flowing through at least one of said liquid coolant supplying header and said liquid coolant discharging header, a direction of flow of said liquid coolant that flows through said liquid coolant supplying header and a direction of flow of said liquid coolant that flows through said liquid coolant discharging header are identical directions.

5. A cooling apparatus according to claim 3, wherein a direction of flow of said liquid coolant that flows through said liquid coolant supplying header and a direction of flow of said liquid coolant that flows through said liquid coolant discharging header are opposite directions.

6. A cooling apparatus according to claim 1, wherein said liquid coolant supplying header and said liquid coolant discharging header are disposed on two sides in said width direction inside said main body portion, and said vertical flow channel is disposed centrally in said width direction inside said main body portion.

7. A cooling apparatus according to claim 1, wherein a direction of flow of said liquid coolant that flows through said liquid coolant supplying header and a direction of flow of said liquid coolant that flows through said liquid coolant discharging header are identical directions.

8. A cooling apparatus according to claim 6, wherein a direction of flow of said liquid coolant that flows through said liquid coolant supplying header and a direction of flow of said liquid coolant that flows through said liquid coolant discharging header are opposite directions.

9. A cooling apparatus according to claim 1, wherein a side surface of said liquid coolant distributing structural body is constituted by a flat surface.

10. A cooling apparatus according to claim 1, wherein a side surface of said liquid coolant distributing structural body is constituted by a curved surface.

11. A cooling apparatus according to claim 1, wherein said coolant enters said liquid coolant supplying header at a liquid coolant supplying port and exits said liquid coolant discharging header at a liquid coolant discharging port, and said flow channel direction is parallel to a line between said liquid coolant supplying port and said liquid coolant discharging port.

12. A cooling apparatus characterized in comprising:
a main body portion that has upper and lower openings;
an upper portion heatsink and a lower portion heatsink that are mounted above and below said main body portion so as to cover said upper and lower openings of said main body portion;
a partitioning plate that is disposed so as to divide an internal portion of said main body portion into upper and lower sections, so as to form an upper portion space with said upper portion heatsinks, and so as to form a lower portion space with said lower portion heatsink;
a liquid coolant supplying header that is formed between one of said upper and lower portion heatsinks and said partitioning plate;
a liquid coolant discharging header that is formed between the other of said upper and lower portion heatsinks and said partitioning plate so as to have a flow channel direction that is parallel to a flow channel direction of said liquid coolant supplying header;
a vertical flow channel that is separated from said liquid coolant supplying header by a predetermined distance in a width direction that is perpendicular to said flow channel directions, that passes through said partitioning plate vertically, that extends at least parallel to said flow channel direction of said liquid coolant supplying header, and that communicates between said upper portion space and said lower portion space; and
a liquid coolant distributing structural body that is disposed inside said liquid coolant supplying header, that is configured into a shape such that a flow channel cross-sectional area of said liquid coolant supplying header becomes gradually smaller from an upstream end toward a downstream end, and that distributes a liquid coolant that flows through said liquid coolant supplying header toward said vertical flow channel,
wherein the liquid coolant supplying header and the liquid coolant discharging header are two separate channels through which the liquid coolant flows,
wherein a width t of said vertical flow channel satisfies 0.75 mm≤t≤6.5 mm,
wherein said upper portion heatsink and said lower portion heatsink comprise groups of radiating fins that are housed in said upper portion space and said lower portion space, and
wherein a portion of a group of said radiating fins extend into at least one of said liquid coolant supplying header and said liquid coolant discharging header, and are formed such that fin height decreases gradually toward a central portion of said header.

13. A cooling apparatus according to claim 12, wherein said groups of said radiating fins are configured such that said radiating fins are arranged such that said liquid coolant meanders.

14. A cooling apparatus characterized in comprising:
a main body portion that has upper and lower openings;
an upper portion heatsink and a lower portion heatsink that are mounted above and below said main body portion so as to cover said upper and lower openings of said main body portion;
a partitioning plate that is disposed so as to divide an internal portion of said main body portion into upper and lower sections, so as to form an upper portion space with said upper portion heatsinks, and so as to form a lower portion space with said lower portion heatsink;
a liquid coolant discharging header that is formed between the other of said upper and lower portion heatsinks and said partitioning plate so as to have a flow channel direction that is parallel to a flow channel direction of said liquid coolant supplying header;
a vertical flow channel that is separated from said liquid coolant supplying header by a predetermined distance in a width direction that is perpendicular to said flow channel directions, channel direction of said liquid coolant supplying header, and that communicates between said upper portion space and said lower portion space; and
a liquid coolant distributing structural body that is disposed inside said liquid coolant supplying header, that is configured into a shape such that a flow channel cross-sectional area of said liquid coolant supplying header becomes gradually smaller from an upstream end toward a downstream end, and that distributes a liquid coolant that flows through said liquid coolant supplying header toward said vertical flow channel,
wherein the liquid coolant supplying header and the liquid coolant discharging header are two separate channels through which the liquid coolant flows,
wherein a width t of said vertical flow channel satisfies 0.75 mm≤t≤6.5 mm, and
wherein said partitioning plate comprises a single resin molded body.

15. A cooling apparatus , comprising: a main body portion that has upper and lower openings;
an upper portion heatsink and a lower portion heatsink that are mounted above and below said main body portion so as to cover said upper and lower openings of said main body portion;
a partitioning plate that is disposed so as to divide an internal portion space of said main body portion into upper and lower sections, so as to form an upper portion space with said upper portion heatsink, and so as to form a lower portion space with said lower portion heatsink;
a liquid coolant supplying header that is formed between one of said upper and lower portion heatsinks and said partitioning plate and carrying liquid coolant in a flow channel direction over a supply flow channel, with said liquid coolant exiting said supply flow channel, in at least one direction transverse to said flow channel direction, at multiple locations along said flow channel direction;
a liquid coolant discharging header that is formed between the other of said upper and lower portion heatsinks and said partitioning plate so as to have a discharge flow channel which substantially overlaps said supply flow channel along said flow channel direction and which carries liquid coolant in a direction that is parallel to said flow channel direction;
a vertical flow channel that is separated from said liquid coolant supplying header by a predetermined distance in a width direction that is perpendicular to said flow channel directions, that passes through said partitioning plate vertically, that extends at least parallel to said flow channel direction of said liquid coolant supplying header, and that communicates between said upper portion space and said lower portion space; and
a liquid coolant distributing structural body that is disposed inside said liquid coolant supplying header, extending from a first side of said internal action s lace to a second side of said internal portion space opposite to said first side in a direction that is parallel to said partitioning plate, that is configured into a shape such that a flow channel cross-sectional area of said liquid coolant supplying header becomes gradually smaller from said first side of said internal portion space toward said second side of said internal portion space, and that distributes a liquid coolant that flows through said liquid coolant supplying header toward said vertical flow channel, and wherein the liquid coolant supplying header and the liquid coolant discharging header are two separate channels through which the liquid coolant flows.

16. A cooling apparatus according to claim 15, wherein said coolant enters said liquid coolant supplying header at a liquid coolant supplying port and exits said liquid coolant discharging header at a liquid coolant discharging port, and said flow channel direction is parallel to a line between said liquid coolant supplying port and said liquid coolant discharging port.

* * * * *